(12) United States Patent
Hsiao et al.

(10) Patent No.: US 12,165,875 B2
(45) Date of Patent: Dec. 10, 2024

(54) SEMICONDUCTOR DEVICE AND METHODS OF FORMATION

(71) Applicant: Taiwan Semiconductor Manufacturing Company, Ltd., Hsinchu (TW)

(72) Inventors: Hsu Ming Hsiao, Hsinchu (TW); Shen Wang, Hsinchu (TW); Kung Shu Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 442 days.

(21) Appl. No.: 17/656,101

(22) Filed: Mar. 23, 2022

(65) Prior Publication Data

US 2023/0307241 A1    Sep. 28, 2023

(51) Int. Cl.
| | |
|---|---|
| *H01L 21/311* | (2006.01) |
| *H01L 21/02* | (2006.01) |
| *H01L 21/3065* | (2006.01) |
| *H01L 21/762* | (2006.01) |
| *H01L 21/8234* | (2006.01) |

(52) U.S. Cl.
CPC .. *H01L 21/31105* (2013.01); *H01L 21/02362* (2013.01); *H01L 21/31111* (2013.01); *H01L 21/31116* (2013.01); *H01L 21/31133* (2013.01); *H01L 21/31138* (2013.01); *H01L 21/3065* (2013.01); *H01L 21/76224* (2013.01); *H01L 21/823418* (2013.01); *H01L 21/823431* (2013.01)

(58) Field of Classification Search
CPC ........ H01L 21/31105; H01L 21/31111; H01L 21/31116; H01L 21/31133; H01L 21/31138
See application file for complete search history.

(56) References Cited

U.S. PATENT DOCUMENTS

| | | |
|---|---|---|
| 2012/0028454 A1 | 2/2012 | Swaminathan et al. |
| 2020/0027741 A1 | 1/2020 | Kal et al. |

*Primary Examiner* — David A Zarneke
(74) *Attorney, Agent, or Firm* — Harrity & Harrity, LLP

(57) ABSTRACT

Recesses may be formed in portions of an ILD layer of a semiconductor device in a highly uniform manner. Uniformity in depths of the recesses may be increased by configuring flows of gases in an etch tool to promote uniformity of etch rates (and thus, etch depth) across the semiconductor device, from semiconductor device to semiconductor device, and/or from wafer to wafer. In particular, the flow rates of gases at various inlets of the etch tool may be optimized to provide recess depth tuning, which increases the process window for forming the recesses in the portions of the ILD layer. In this way, the increased uniformity of the recesses in the portions of the ILD layer enables highly uniform capping layers to be formed in the recesses.

20 Claims, 35 Drawing Sheets

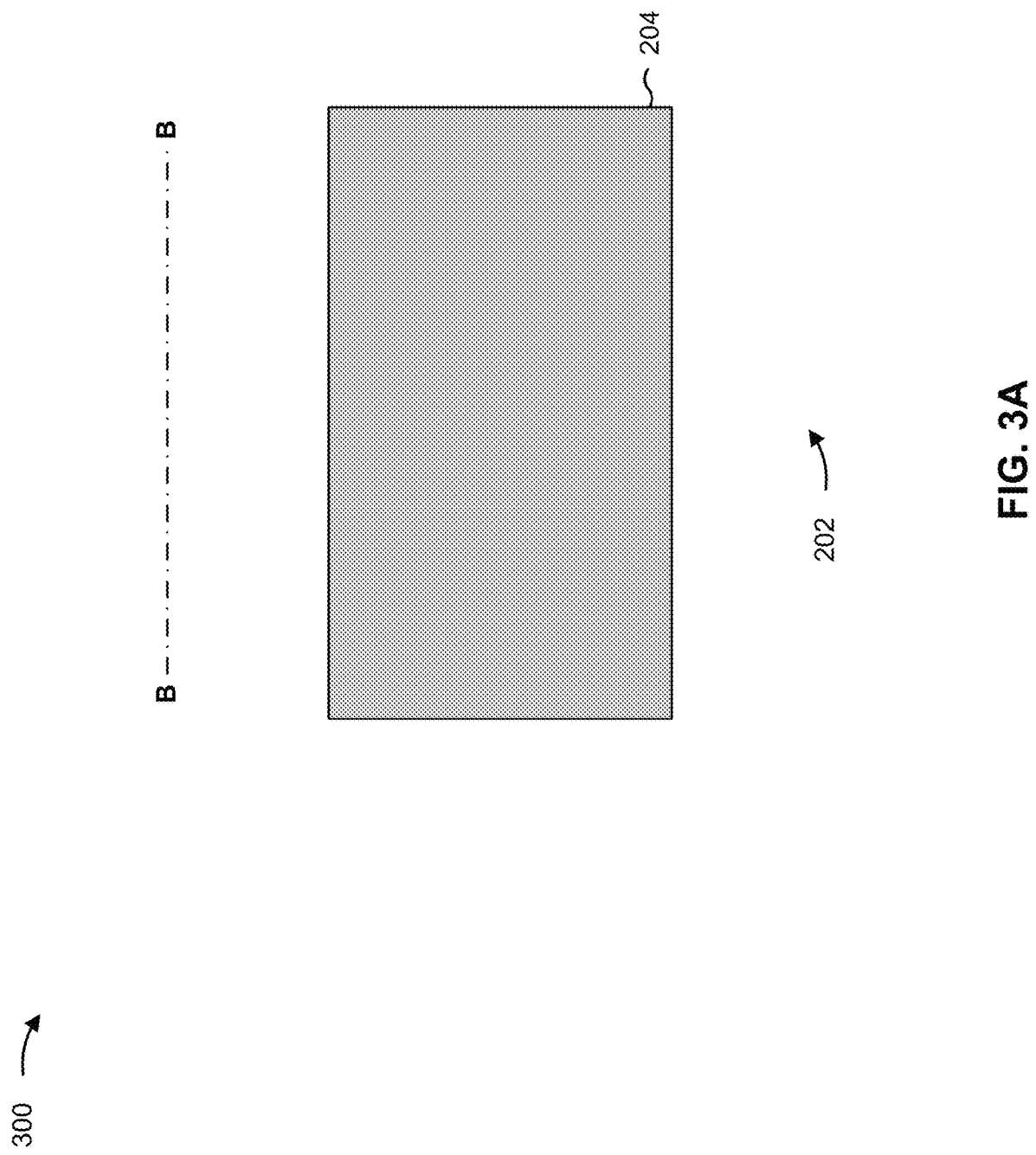

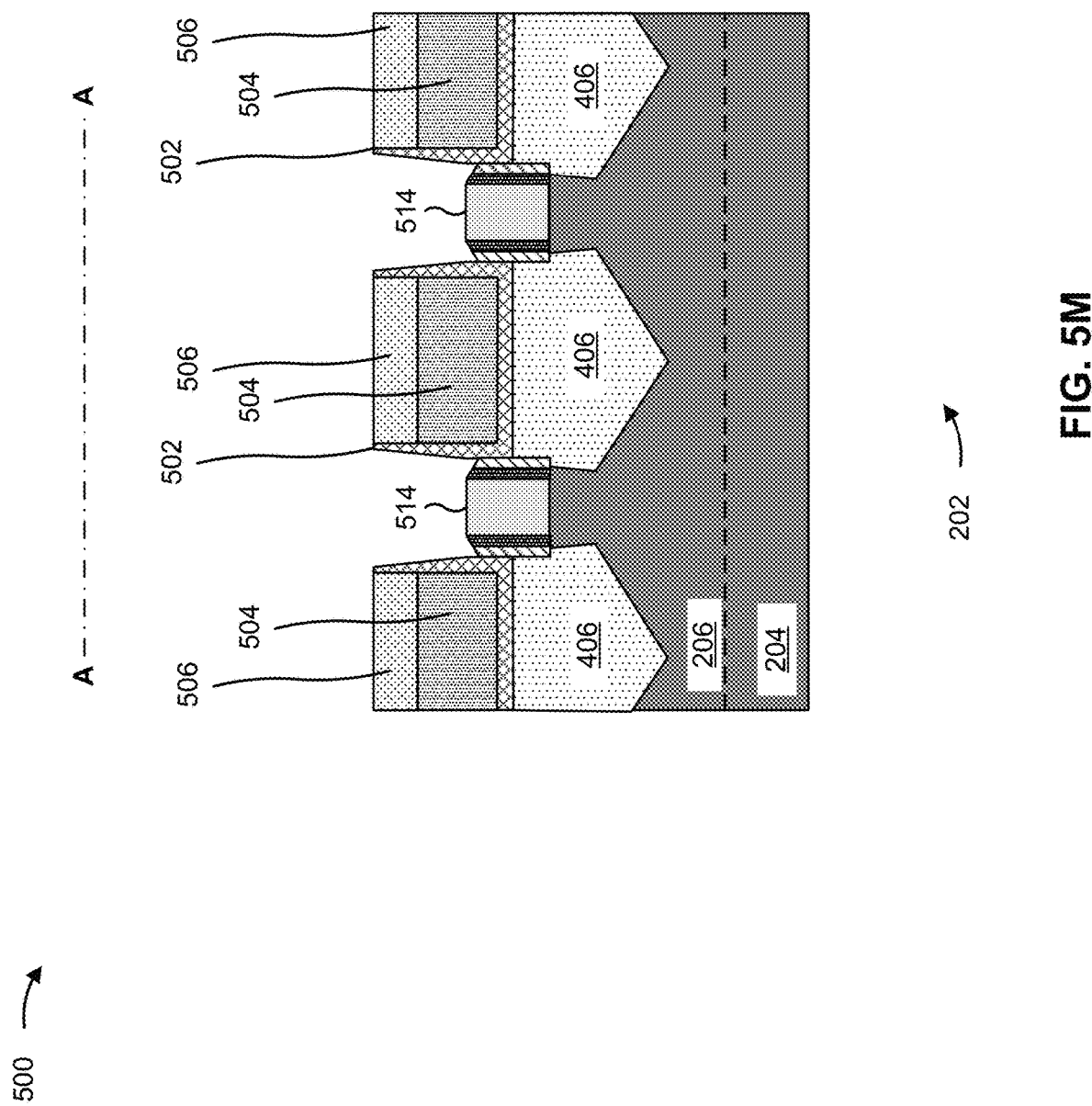

SEMICONDUCTOR DEVICE AND METHODS OF FORMATION

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D, 4A-4C, 5A-5O, and 6A-6F are diagrams of one or more example implementations described herein.

DETAILED DESCRIPTION

Figure 1A:
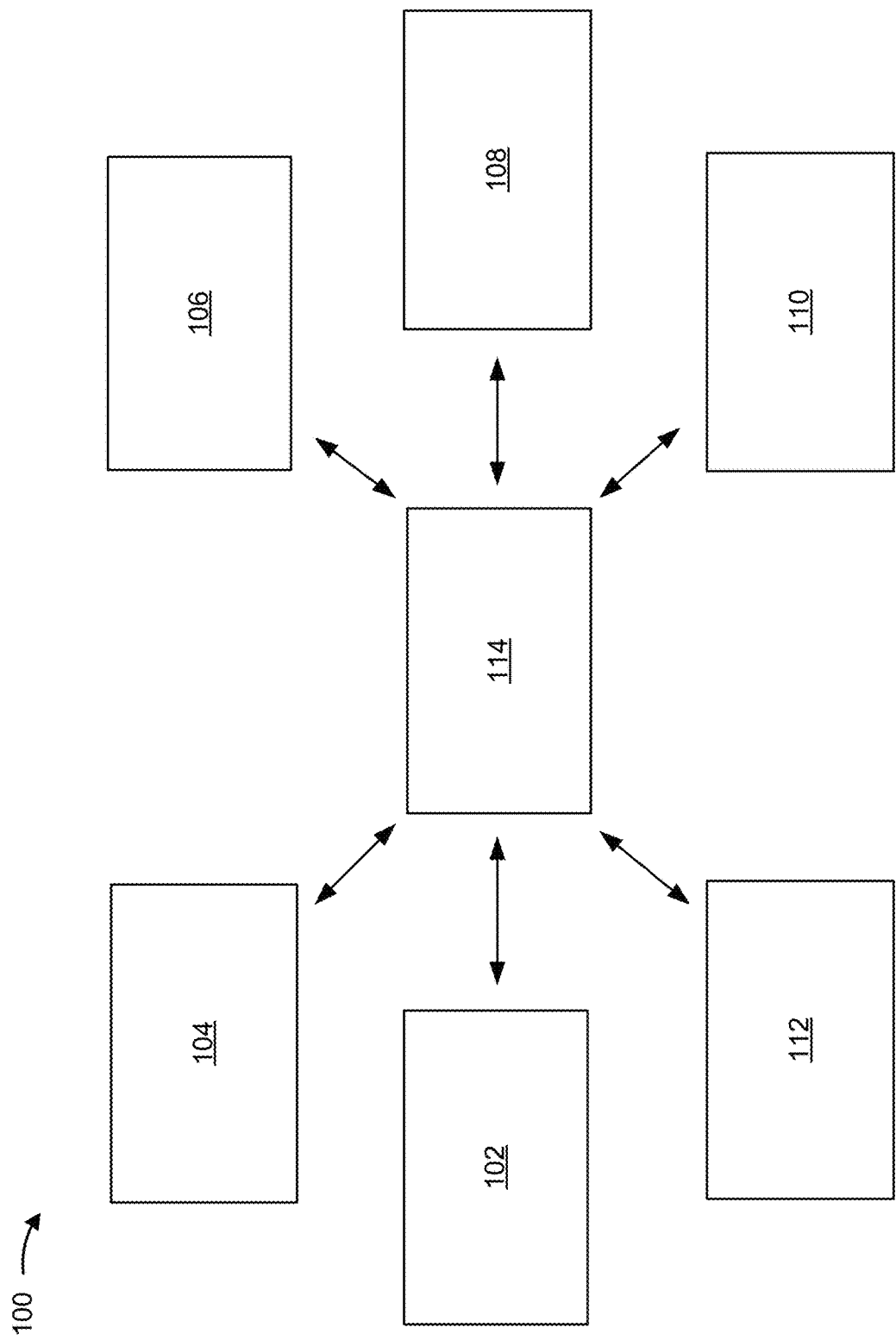
FIGS. 1A and 1B are diagrams of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Hard mask layers or capping layers are often used in semiconductor processing as a "helmet" to protect underlying layers from damage while other layers of a semiconductor device are processed. As an example, a capping layer (referred to as a self-aligned contact or self-aligned cap (SAC)) may be formed over a metal gate (MG) structure to protect the metal gate structure from damage during formation of source/drain contacts (MDs) for a semiconductor. As another example, a portion of an interlayer dielectric (ILD) layer may be recessed, and the recess may be filled with a capping layer to protect the ILD layer from damage during a replacement gate (RPG) process in which a dummy gate structure is replaced with a metal gate structure.

Process variation in forming capping layers may reduce the effectiveness and/or yield of subsequent processes for forming a semiconductor device. For example, variation in the thickness of capping layers over portions of an ILD layer may result in portions of some of the capping layers remaining after a planarization operation to remove the capping layers. The remaining portions can reduce an etching depth of the ILD layer (and/or altogether prevent etching of the ILD layer), which may result in failure to form a source/drain contact to an underlying source/drain region. As another example, variation in the thickness of capping layers over portions of an ILD layer may result in dishing or void formation during a planarization operation to remove the capping layers. This may result in etching of adjacent SACs, which increases gate height loading (e.g., increases the amount of etching of the adjacent SACs) and/or increases a likelihood of metal gate damage and/or de-footing. These processing defects can reduce semiconductor device yield and/or reduce semiconductor device performance, among other examples.

Some implementations described herein provide techniques for forming highly uniform hard mask layers or capping layers in a semiconductor device. As described herein, recesses may be formed in portions of an ILD layer of a semiconductor device. The uniformity in the depths of the recesses may be increased by configuring flows of gases in an etch tool to promote uniformity of etch rates (and thus, etch depth) across the semiconductor device, from semiconductor device to semiconductor device, and/or from wafer to wafer. In particular, the flow rates of gases at various inlets of the etch tool may be optimized to provide recess depth tuning, which increases the process window for forming the recesses in the portions of the ILD layer. In this way, the increased uniformity of the recesses in the portions of the ILD layer enables highly uniform capping layers to be formed in the recesses. For example, the techniques described herein may enable the uniformity of recesses formed in portions of an ILD layer (and thus, the uniformity in thickness of capping layers to be formed in the recesses) from approximately 4 nanometers of variation to approximately 1.6 nanometers of variation or less. However, other values are within the scope of the present disclosure. The uniformity of the resulting capping layers decreases the likelihood of defect formation and/or yield loss of semiconductor devices formed on a wafer and/or increases the performance of the semiconductor devices, among other examples.

Figure 1B:
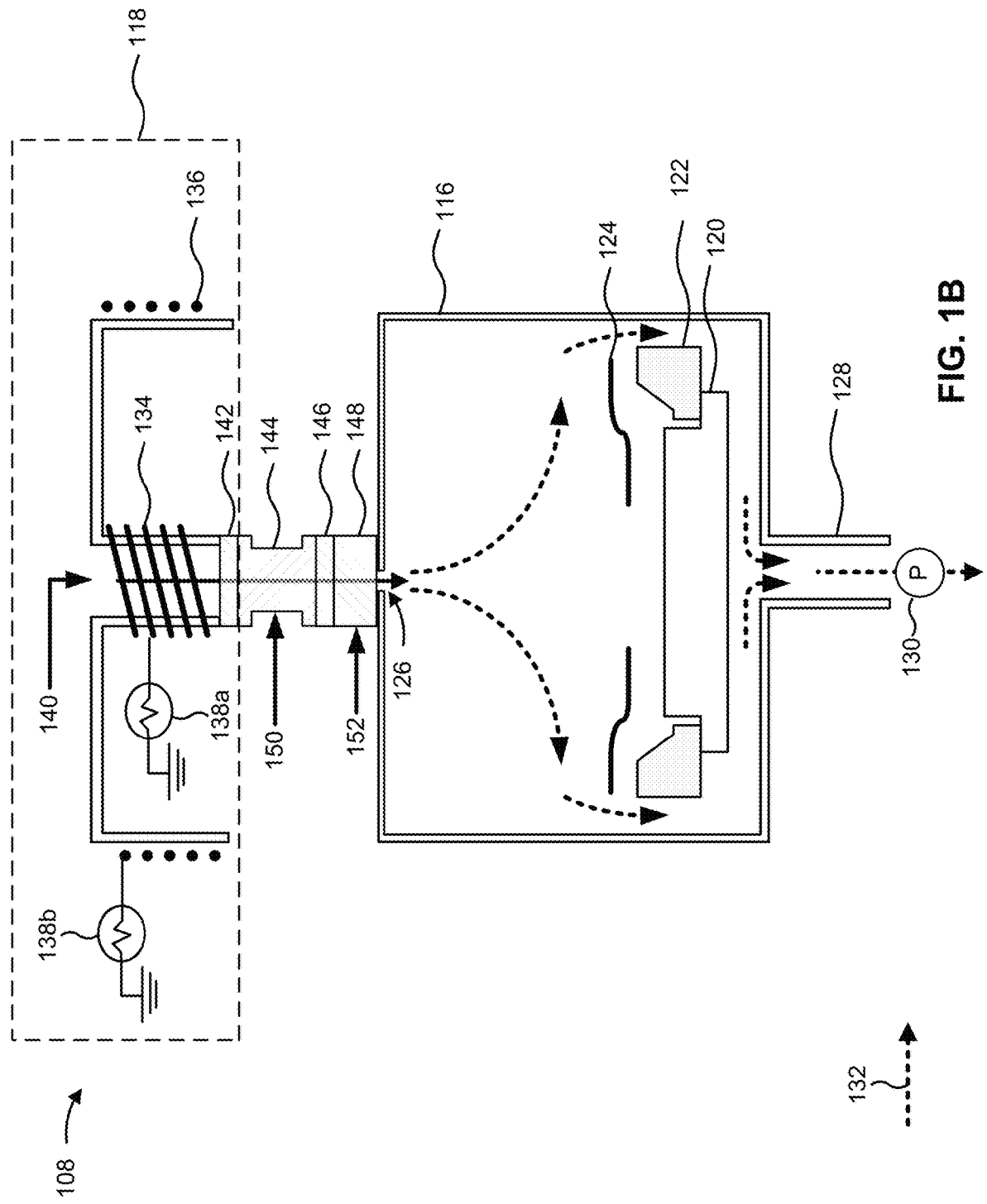

FIGS. 1A and 1B are diagrams of an example environment 100 in which systems and/or methods described herein may be implemented. As shown in FIG. 1A, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

FIG. 1B is a cross-sectional view of an example implementation of the etch tool 108. The etch tool 108 shown in FIG. 1B includes a plasma-based etch tool. In particular, the etch tool 108 shown in FIG. 1B includes a type of dry etch tool that is capable of using plasma ions to etch or remove portions of a semiconductor wafer or layers/structures formed thereon. In some implementations, the etch tool 108 is a plasma etch tool for etching metals on a semiconductor wafer. In some implementations, the etch tool 108 is a decoupled plasma source (DPS) tool, an inductively coupled plasma (ICP) tool, a transformer coupled plasma (TCP) tool, or another type of plasma etch tool.

As shown in FIG. 1B the etch tool 108 includes a processing chamber 116. The processing chamber 116 includes a chamber that is capable of being hermetically sealed so that the processing chamber 116 can be pressurized (e.g., to a vacuum or a partial vacuum). In some implementations, the processing chamber 116 is sized to accommodate a particular size of wafer such as a 200 millimeter wafer. In some implementations, the processing chamber 116 is sized to accommodate various sizes of semiconductor wafers, such as a 150 millimeter semiconductor wafer, a 200 millimeter semiconductor wafer, a 300 millimeter wafer, and/or another sized semiconductor wafer. The etch tool 108 includes a remote plasma source (RPS) 118 that is configured to generate a plasma and provide or supply the plasma to the processing chamber 116. The RPS 118 may also be referred to as a plasma supply system. The RPS 118 generates the plasma remotely from the processing chamber 116.

A chuck 120 is included in the processing chamber 116. The chuck 120 is configured to support and secure a semiconductor wafer in the processing chamber 116. The chuck 120 includes an electrostatic chuck (e-chuck or ESC) or another type of chuck (e.g., a vacuum chuck) that is configured to hold and/or secure a semiconductor wafer in the processing chamber 116 during processing (e.g., plasma etching) of the semiconductor wafer. In implementations in which the chuck 120 includes an electrostatic chuck, the chuck 120 is configured to generate an electrostatic attracting force between the chuck 120 and the semiconductor wafer based on a voltage applied to the chuck 120. Moreover, a voltage may be provided to the chuck 120 from a power supply. The voltage may generate the electrostatic attracting force that secures the semiconductor wafer to the chuck 120.

The chuck 120 may be sized and shaped depending on a size and a shape of semiconductor wafer to be processed in the etch tool 108. For example, the chuck 120 may be circular shaped and may support all or a portion of a circular shaped semiconductor wafer. In some implementations, the chuck 120 is constructed of a material or materials that are resistant to abrasion and/or corrosion caused by materials used to generate the plasma, and that can generate the attractive force between the chuck 120 and a semiconductor wafer. For example, the chuck 120 may be constructed of a metal, such as aluminum, stainless steel, or another suitable material.

A focus ring 122 is included in the processing chamber 116. The focus ring 122 (also referred to as an edge ring or a single ring) includes a ring-shaped structure that is positioned around a portion of the chuck 120. The focus ring 122 is configured to focus the plasma in the processing chamber 116 toward a semiconductor wafer on the chuck 120 by directing (or redirecting) at least a portion of the plasma toward the semiconductor wafer. In this way, the focus ring 122 may increase electrical and plasma fluid uniformity in the processing chamber 116. In some implementations, a voltage is applied to the focus ring 122 (e.g., from a power supply) so that the focus ring 122 provides the electrical and plasma uniformity. The focus ring 122 may be sized and shaped depending on a size and a shape of semiconductor wafer to be processed in the etch tool 108. For example, the focus ring 122 may be circular shaped and may include an opening to enable the focus ring 122 to surround a semiconductor wafer on the chuck 120. In some implementations, the focus ring 122 is constructed of a material or materials that are resistant to abrasion and/or corrosion caused by materials used to generate the plasma, and that can provide the electrical and plasma uniformity for a semiconductor wafer. For example, the focus ring 122 may be constructed of a metal, such as aluminum, stainless steel, and/or another suitable material.

During a plasma operation of a semiconductor wafer in the etch tool 108, a bias voltage may be applied to the chuck 120 such that an electric field is generated between the semiconductor wafer and the plasma in the processing chamber 116. The bias voltage may include a negative bias voltage, which results in an excess of positively charged ions in a layer of the plasma above the semiconductor wafer. This dense layer of positively charged ions is referred to as a sheath 124, which may also be referred to as a plasma sheath, an electrostatic sheath, or a Debye sheath. The bias voltage may be used to control the flow rate and direction of ions in the processing chamber 116 to adjust the etching properties of the plasma.

The RPS 118 may include a process gas source to provide a gas flow (e.g., argon or another type of gas flow) to the processing chamber 116. The RPS 118 may provide the plasma and the gas flow to the processing chamber 116 through an inlet port 126 in a first side (e.g., a top side) of the processing chamber 116. The plasma and the gas flow are removed from the processing chamber 116 through an exhaust port 128 (or outlet port) at an opposing side (e.g., a bottom side) of the processing chamber 116. The etch tool 108 includes a vacuum pump 130 to facilitate the generation of a flow path 132 of the plasma and the gas flow between the inlet port 126 and the exhaust port 128. For example, and as shown in the example in FIG. 1B, the flow path 132 originates at the inlet port 126, the flow path 132 expands outward in the processing chamber 116 and flows around the chuck 120 and the focus ring 122, and downward under the chuck 120 toward the exhaust port 128. The vacuum pump 130 may be further configured to control the pressure in the processing chamber 116 and to generate a vacuum (or partial vacuum) in the processing chamber 116.

As further shown in FIG. 1B, the RPS 118 includes an inner plasma source 134 and an outer plasma source 136. The inner plasma source 134 and the outer plasma source 136 include independently controllable plasma sources that, in combination, are configured to control and shape the plasma in the processing chamber 116. For example, the power, voltage, and/or other parameters may be independently configurable for inner plasma source 134 and the outer plasma source 136 to provide a plasma to the processing chamber 116 such that the plasma includes a particular electric field distribution, a particular ion composition and/or distribution, and/or a particular ion bombardment direction or angle, among other examples such that the intensity of the plasma is greater in particular areas in the processing chamber 116 relative to other areas of the processing chamber 116.

The inner plasma source 134 and the outer plasma source 136 are respectively connected to radio frequency (RF) sources 138a and 138b. The RF source 138a and the RF source 138b may be referred to as a bias RF sources in that the RF source 138a and the RF source 138b are configured to provide or supply an RF or alternating current to the inner plasma source 134 and the outer plasma source 136, respectively, to bias the inner plasma source 134 and the outer plasma source 136. The inner plasma source 134 and/or the outer plasma source 136 may be biased to increase or decrease the strength of attraction of the ions in the plasma, which may be used to increase or decrease the etch rate (or etch rate distribution) for a semiconductor wafer. The RF source 138a and the RF source 138b may each be connected to an electrical ground and may each include RF power supply or another type of device that is capable of generating and providing/supplying an RF current in a suitable frequency range such as approximately 10 MHz to approximately 30 MHz or approximately 300 MHz to approximately 300 GHz, among other examples.

To generate the plasma, the RF sources 138a and 138b may provide RF or alternating current to the inner plasma source 134 and the outer plasma source 136, respectively. The RF or alternating current may traverse through and/or along the coiled conductors of the inner plasma source 134 and the outer plasma source 136, which generates a time-varying electromagnetic field through electromagnetic induction. The time-varying electromagnetic field may create an electromotive force, which energizes a gas flow with electrons, thereby forming the plasma.

The RPS 118 may include a gas inlet 140 through which a carrier gas such as argon (Ar) and/or another carrier gas is supplied to the RPS 118. The carrier gas is used to carry the plasma from the RPS 118 to the processing chamber 116 through the inlet port 126.

The plasma may be provided from the RPS 118 to the processing chamber 116 of the etch tool 108 through one or more components, including an RPS insulator 142, an inlet adapter 144, a diffuser plate 146, and a mixing manifold 148, among other examples. The RPS insulator 142 may be configured to provide an electrical break between the RPS 118 and the processing chamber 116. The RPS insulator 142 may be approximately ring-shaped and may include a non-conductive material, such as a ceramic material. The inlet adapter 144 may be configured to couple or adapt the RPS 118 to the processing chamber 116. The diffuser plate 146 is configured to promote diffusion and/or dispersion of the plasma and one or more etchants in the mixing manifold 148. The mixing manifold 148 includes a chamber in which the plasma is mixed with one or more etchants prior to entry into the processing chamber 116. In some implementations, the mixing manifold 148 includes a non-linear or non-straight flow path to facilitate and/or promote mixing of the plasma and etchant(s).

Etchants may be provided into the etch tool 108 through one or more gas inlets. For example, a reactant or etchant (e.g., ammonia ($NH_3$) or another reactant) may be provided into the inlet adapter 144 through a gas inlet 150 that is located in the inlet adapter 144. As another example, another reactant or etchant (e.g., hydrofluoric acid (HF) or another reactant) may be provided directly into the mixing manifold 148 through a gas inlet 152 that is located in the mixing manifold 148. Accordingly, the gas inlet 152 is located closer to the inlet port 126 relative to the gas inlets 150 and 140, and is downstream relative to the gas inlets 150 and 140. Moreover, the gas inlet 150 is located closer to the inlet port 126 relative to the gas inlet 140, and is located downstream relative to the gas inlet 140 and upstream relative to the gas inlet 152. In some implementations, one or more of the gas inlets may be included in another location of the etch tool 108, such as the RPS insulator 142, the diffuser plate 146, and/or another location. The etchant(s) may be provided through the gas inlets 150 and 152 using a carrier gas such as argon (Ar) and/or another inert gas.

While the etch tool 108 is capable of performing plasma-based etching, in some implementations, the etch tool 108 may be operated to perform a dry etch operation without the use of plasma. In these implementations, the RPS 118 is not used to generate and provide a plasma, and the etchant(s) provided into the etch tool 108 are used to dry etch a semiconductor device. The carrier gas that is provided into the etch tool 108 through the gas inlet 140 of the RPS 118 is instead used to prevent backflow of etchants out of the etch tool 108 through the RPS 118.

The number and arrangement of devices shown in FIGS. 1A and 1B are provided as one or more examples. In practice, there may be additional devices, fewer devices, different devices, or differently arranged devices than those shown in FIGS. 1A and/or 1B. Furthermore, two or more devices shown in FIGS. 1A and/or 1B may be implemented within a single device, or a single device shown in FIGS. 1A and/or 1B may be implemented as multiple, distributed devices. Additionally, or alternatively, a set of devices (e.g., one or more devices) of environment 100 may perform one or more functions described as being performed by another set of devices of environment 100.

Figure 2:
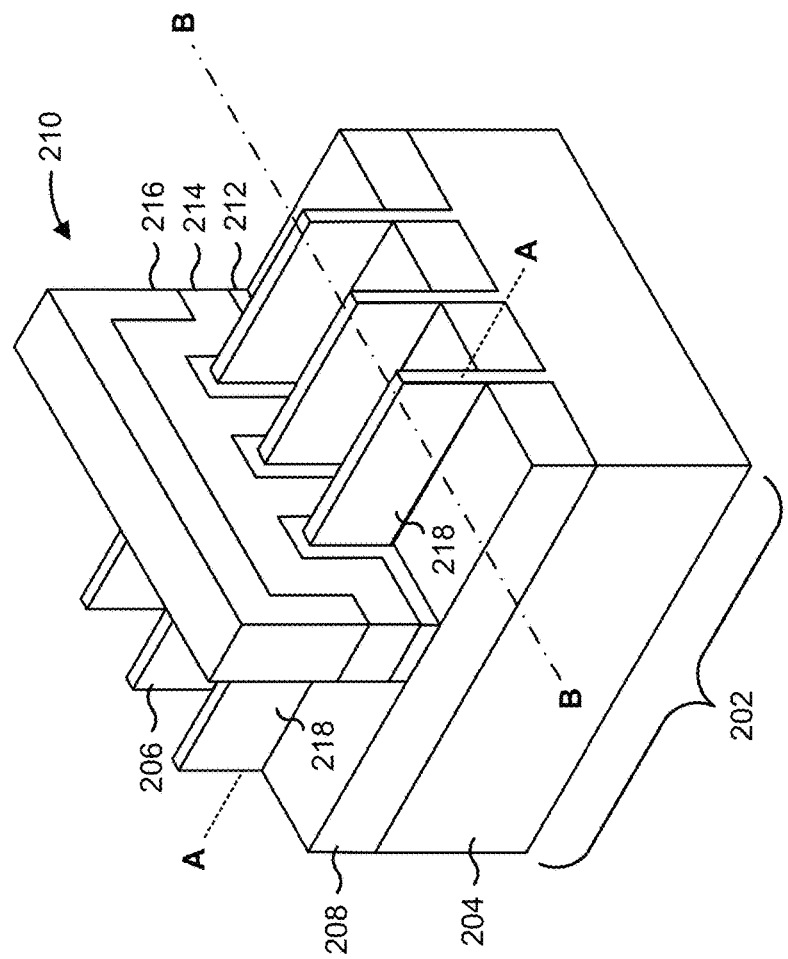
FIG. 2 is a diagram of an example semiconductor device described herein.

FIG. 2 is a diagram of example regions of a semiconductor device 200 described herein. In particular, FIG. 2 illustrates an example device region 202 of the semiconductor device 200 in which one or more transistors or other devices are included. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region. FIGS. 3A-6F are schematic cross-sectional views of various portions of the device region 202 of the semiconductor device 200 illustrated in FIG. 2, and correspond to various processing stages of forming fin-based transistors in the device region 202 of the semiconductor device 200.

The semiconductor device 200 includes a substrate 204. The substrate 204 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 204 may include a round/circular substrate having an approximately 200 mm diameter, an approximately 300 mm diameter, or another diameter, such as 450 mm, among other examples. The substrate 204 may alternatively be any polygonal, square, rectangular, curved, or otherwise non-circular workpiece, such as a polygonal substrate.

Fin structures 206 are included above (and/or extend above) the substrate 204 for the device region 202. A fin structure 206 may provide an active region where one or more devices (e.g., fin-based transistors) are formed. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the substrate 204 away to form recesses in the substrate 204. The recesses may then be filled with isolating material that is recessed or etched back to form shallow trench isolation (STI) regions 208 above the substrate 204 and between the fin structures 206. Other fabrication techniques for the STI regions 208 and/or for the fin structures 206 may be used. The STI regions 208 may electrically isolate adjacent active areas in the fin structures 206. The STI regions 208 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 208 may include a multi-layer structure, for example, having one or more liner layers.

A dummy gate structure 210 (or a dummy gate stack) is included in the device region 202 over the fin structures 206 (e.g., approximately perpendicular to the fin structures 206). The dummy gate structure 210 engages the fin structures 206 on three or more sides of the fin structures 206. In the example depicted in FIG. 2, the dummy gate structure 210 includes a gate dielectric layer 212, a gate electrode layer 214, and a hard mask layer 216. In some implementations, the dummy gate structure 210 further includes a capping layer, one or more spacer layers, and/or another suitable layer. The various layers of the dummy gate structure 210 may be formed by suitable deposition techniques and patterned by suitable photolithography and etching techniques.

The term, "dummy", as described here, refers to a sacrificial stack which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process. Accordingly, the configuration of the semiconductor device 200 illustrated in FIG. 2 may include an intermediate configuration, and additional semiconductor processing operations may be performed for the semiconductor device 200 to further process the semiconductor device 200.

The gate dielectric layer 212 may include a dielectric oxide layer. The dielectric oxide layer may be formed by chemical oxidation, thermal oxidation, ALD, CVD, and/or other suitable methods. The gate electrode layer 214 may include a polysilicon (PO) material or another suitable material. The gate electrode layer 214 may be formed by suitable deposition processes such as LPCVD or PECVD, among other examples. The hard mask layer 216 may include any material suitable to pattern the gate electrode layer 214 with particular features/dimensions on the substrate 204.

In some implementations, the various layers of the dummy gate structure 210 are first deposited as blanket layers. Then, the blanket layers are patterned through a process including photolithography and etching processes, removing portions of the blanket layers and keeping the remaining portions over the STI regions 208 and the fin structures 206 to form the dummy gate structure 210.

Source/drain areas 218 are disposed in opposing regions of the fin structures 206 with respect to the dummy gate structure 210. The source/drain areas 218 include areas in the device region 202 in which source/drain regions are to be formed. The source/drain regions in the device region 202 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

Some source/drain regions may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions are electrically connected, such as through coalescing the regions by epitaxial growth (e.g., neighboring source/drain regions, as opposed to on opposing sides of the dummy gate structure 210, being coalesced), two functional transistors may be implemented. Other configurations in other examples may implement other numbers of functional transistors.

FIG. 2 further illustrates reference cross-sections that are used in later figures, including FIGS. 3A-6F. Cross-section A-A is in a plane along a channel in a fin structure 206 between opposing source/drain areas 218. Cross-section B-B is in a plane perpendicular to cross-section A-A, and is across a source/drain area 218 in fin structure 206. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

Figure 3B:
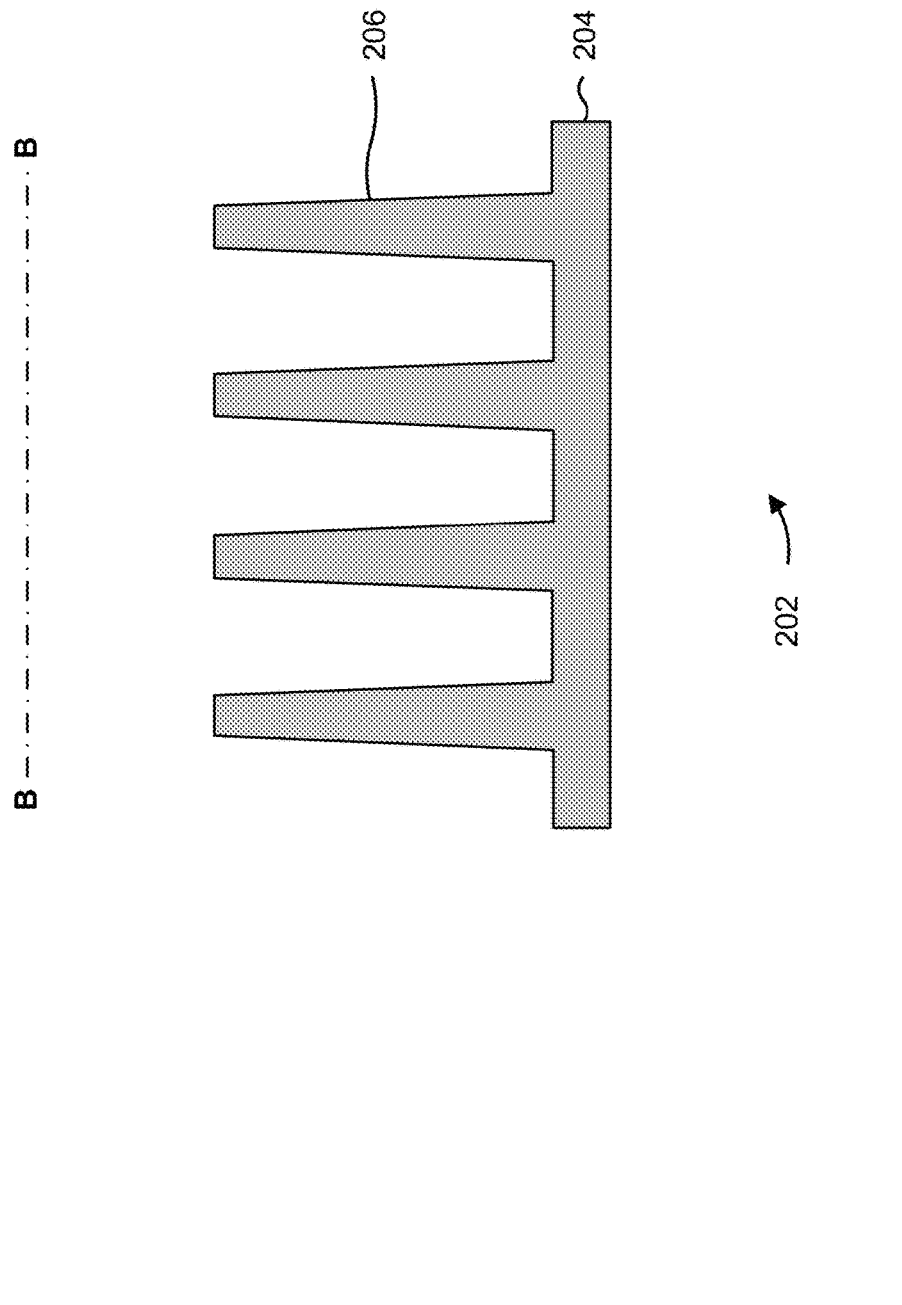

FIGS. 3A-3D are diagrams of an example implementation 300 described herein. The example implementation 300 includes an example of forming fin structures 206 for transistors in the device region 202 of the semiconductor device 200. FIGS. 3A-3D are illustrated from the perspective of the cross-sectional plane B-B in FIG. 2 for the device region 202. Turning to FIG. 3A, the example implementation 300 includes semiconductor processing operations relating to the substrate 204 in and/or on which transistors are formed in the device region 202.

As shown in FIG. 3B, the fin structures 206 are formed in the substrate 204 in the device region 202. In some implementations, a pattern in a photoresist layer is used to form the fin structures 206. In these implementations, the deposition tool 102 forms the photoresist layer on the substrate 204. The exposure tool 104 exposes the photoresist layer to a radiation source to pattern the photoresist layer. The developer tool 106 develops and removes portions of the photoresist layer to expose the pattern. The etch tool 108 etches into the substrate 204 to form the fin structures 206. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 206 based on a pattern.

Figure 3C:
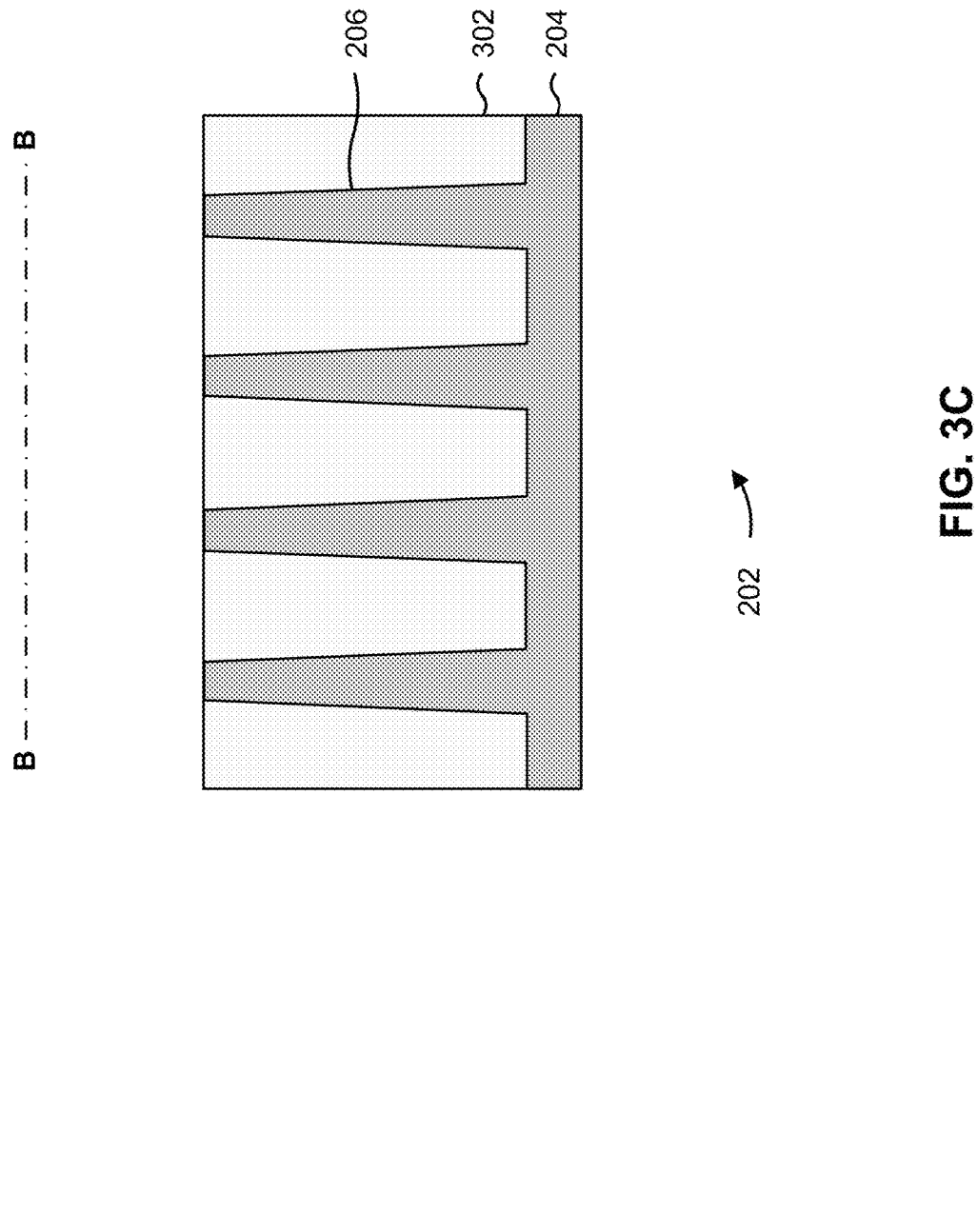

As shown in FIG. 3C, an STI layer 302 is formed in between the fin structures 206. The deposition tool 102 deposits the STI layer 302 using a CVD technique, a PVD technique, an ALD technique, a deposition technique described above in connection with FIG. 1A, and/or another deposition technique. In some implementations, the STI layer 302 is formed to a height that is greater than the height of the fin structures 206. In these implementations, the planarization tool 110 performs a planarization (or polishing) operation to planarize the STI layer 302 such that the top surface of the STI layer 302 is substantially flat and smooth, and such that the top surface of the STI layer 302 and the top surface of the fin structures 206 are approximately the same height. The planarization operation may increase uniformity in the STI regions 208 that are formed from the STI layer 302 in a subsequent etch-back operation.

Figure 3D:
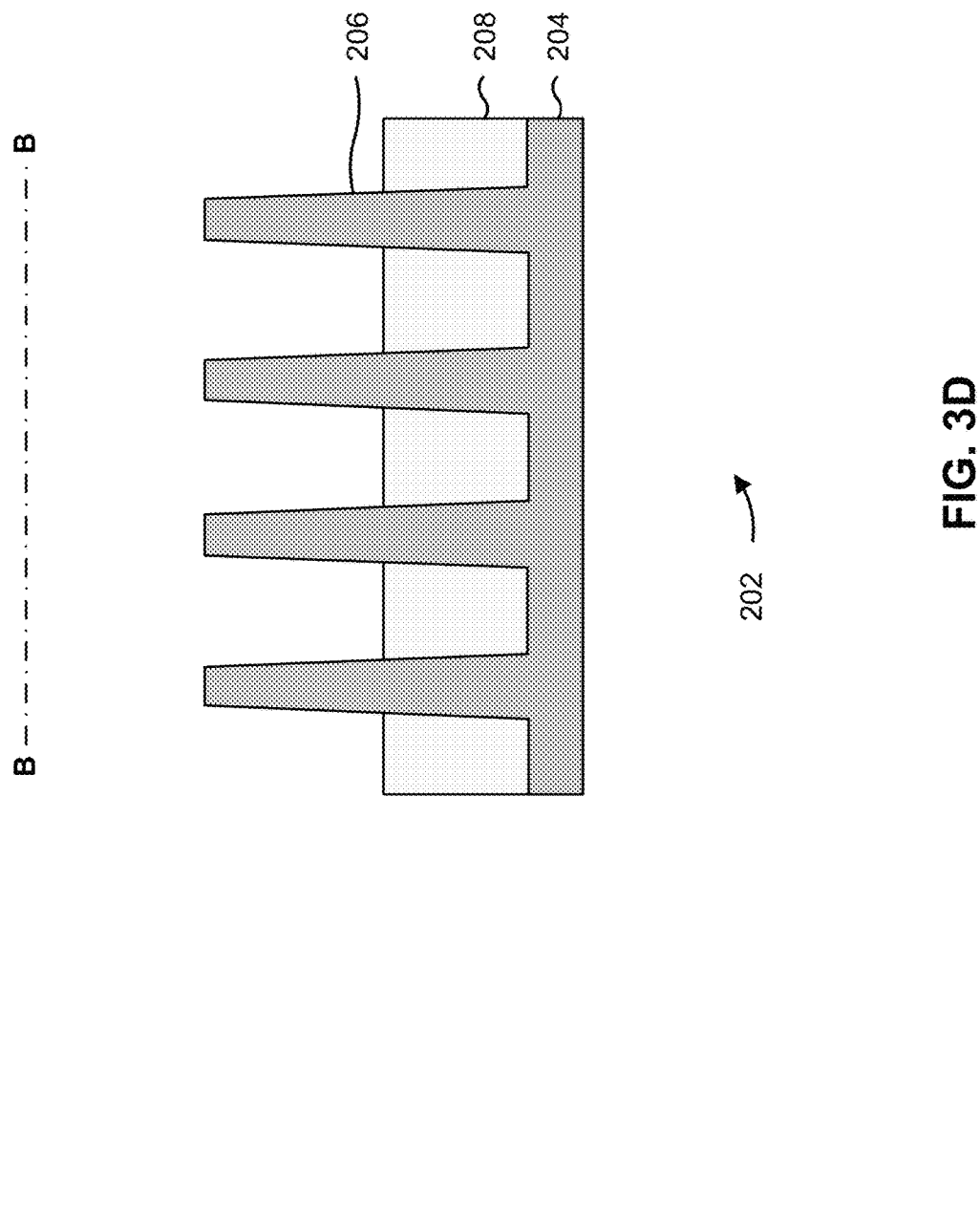

As shown in FIG. 3D, the STI layer 302 is etched in an etch back operation to expose portions of the fin structures 206. The etch tool 108 etches a portion of the STI layer 302 using a plasma etch technique, a wet chemical etch technique, and/or another type of etch technique. The remaining portions of the STI layer 302 between the fin structures 206 include the STI regions 208. In some implementations, the STI layer 302 is etched such that the height of the exposed portions of the fin structures 206 (e.g., the portions of the fin structures 206 that are above the top surface of the STI regions 208) are the same height in the device region 202. In some implementations, a first portion of the STI layer 302 in the device region 202 is etched and a second portion of the STI layer 302 in the device region 202 is etched such that the height of exposed portions of a first subset of the fin structures 206 and the height of the exposed portions of a second subset of the fin structures 206 are different, which enables the fin heights to be tuned to achieve particular performance characteristics for the device region 202.

As indicated above, FIGS. 3A-3D are provided as an example. Other examples may differ from what is described with regard to FIGS. 3A-3D.

Figure 4A:
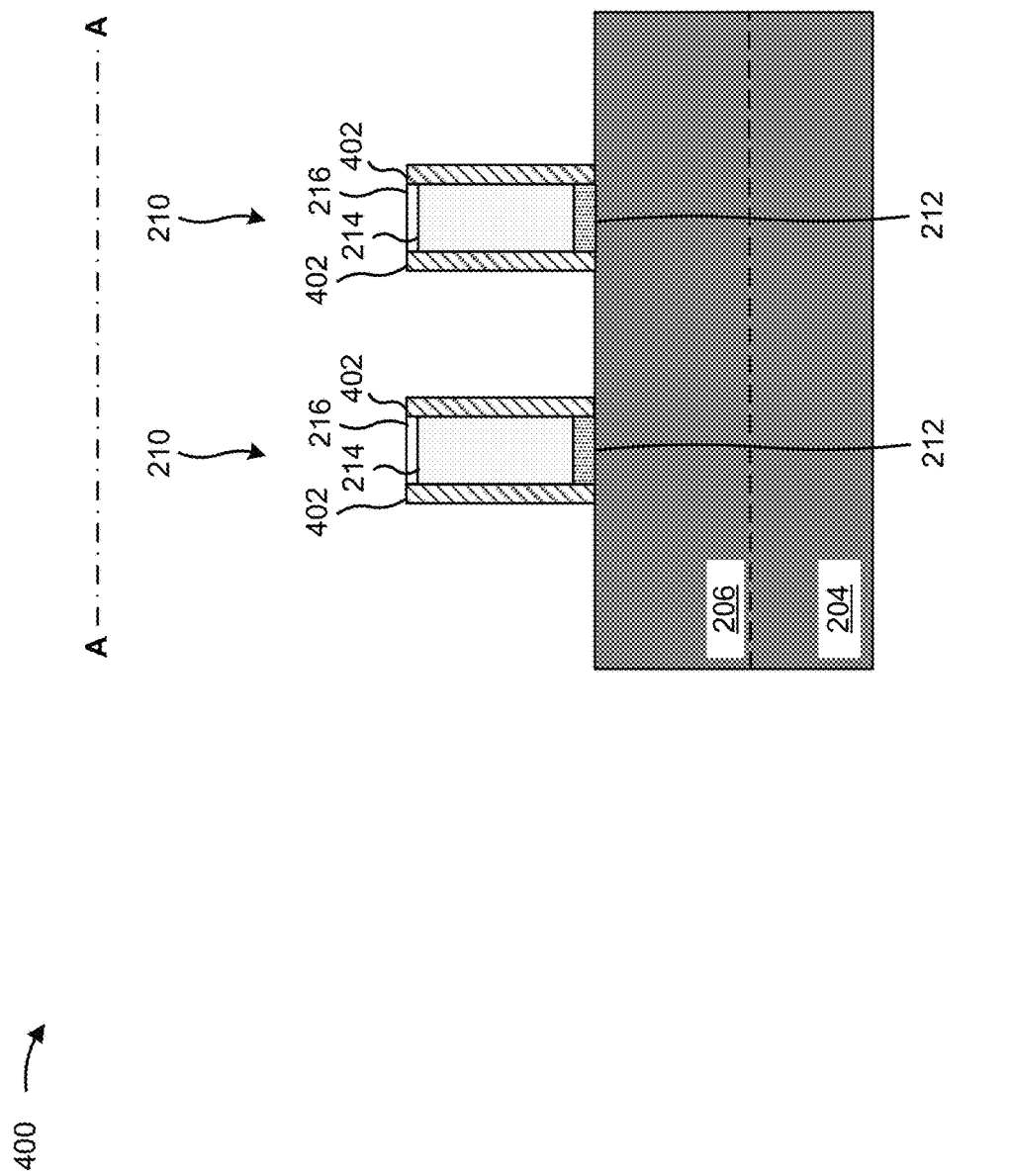
Figure 4B:
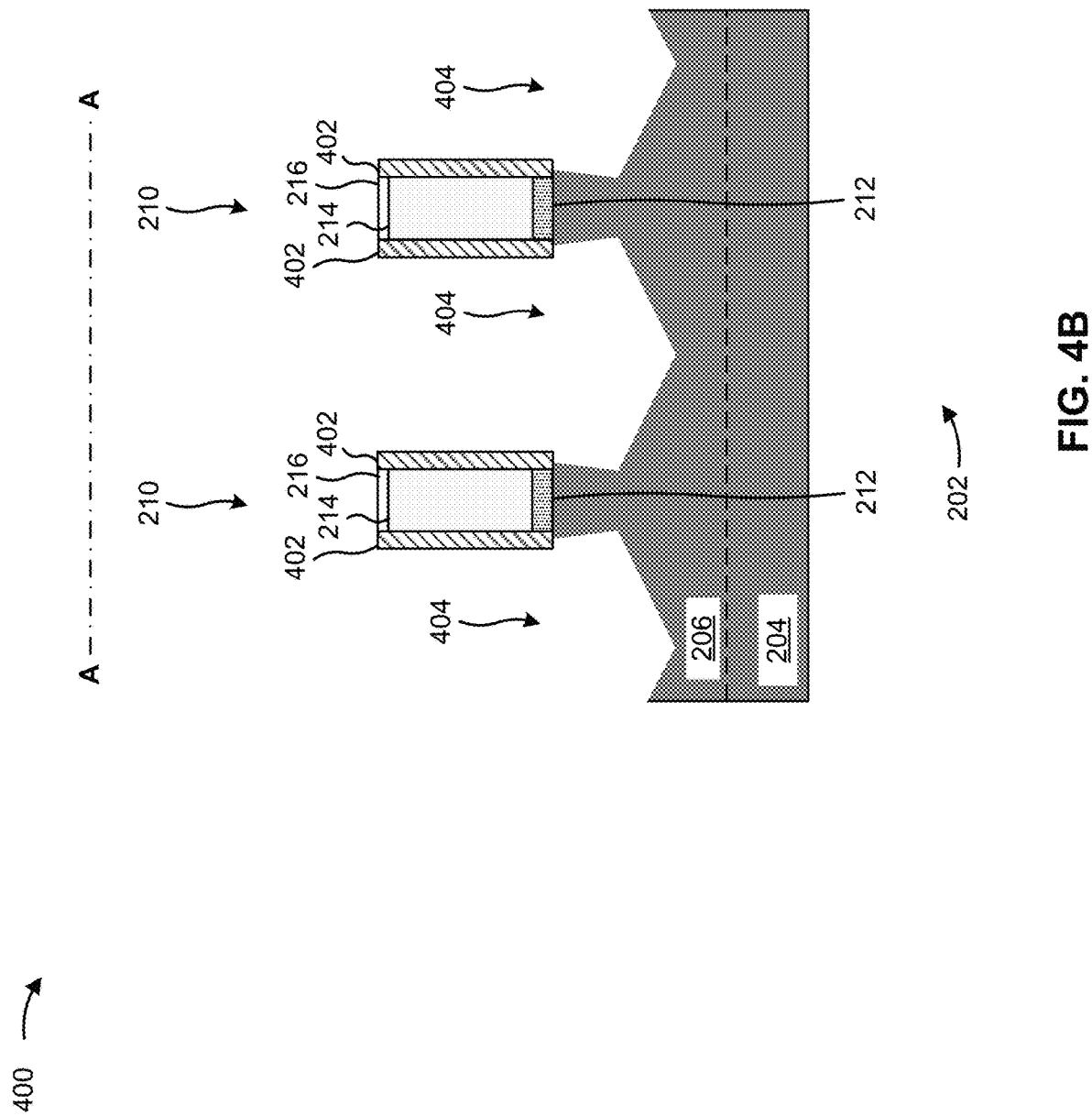
Figure 4C:
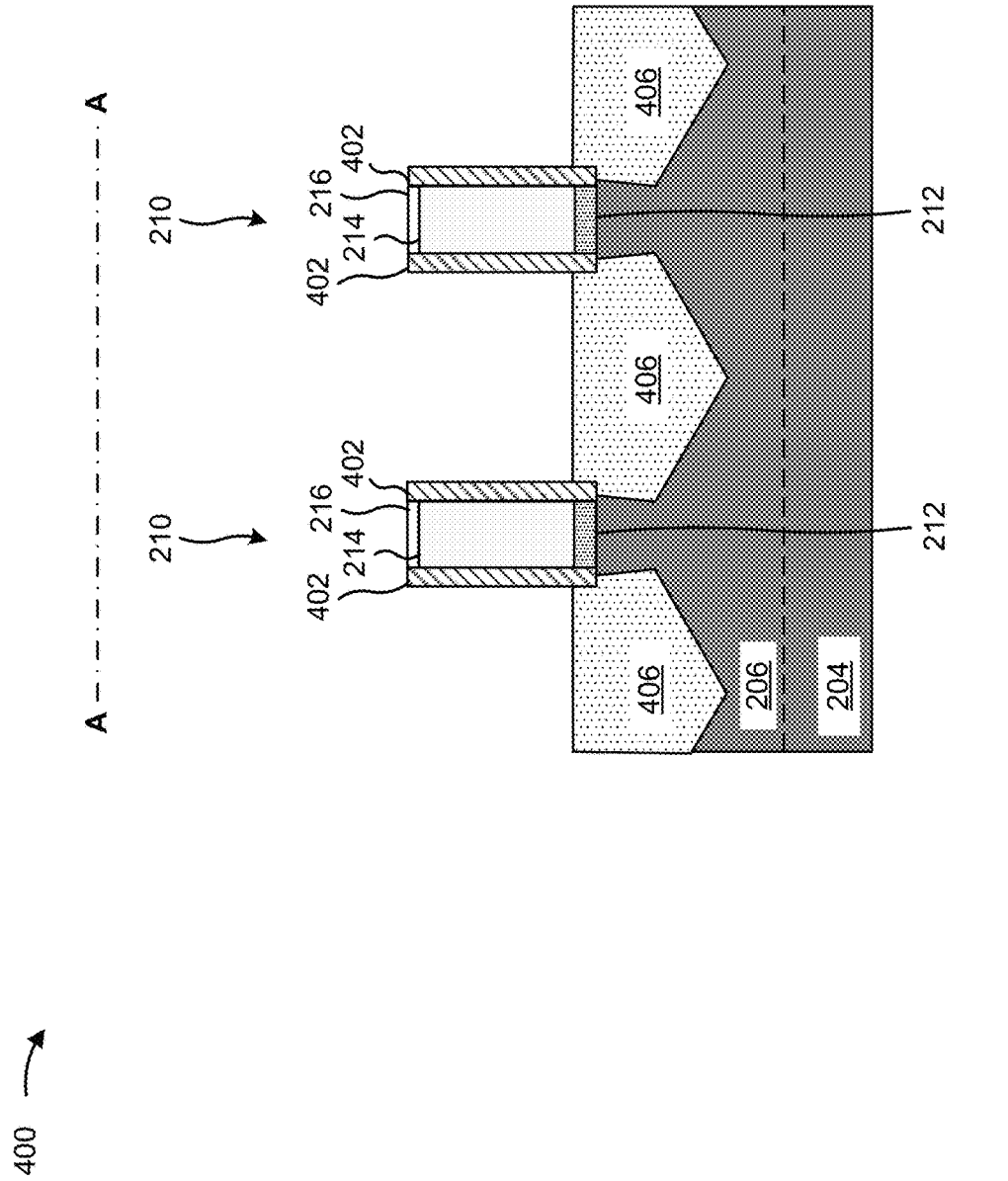

FIGS. 4A-4C are diagrams of an example implementation 400 described herein. The example implementation 400 includes an example of forming source/drain regions in the source/drain areas 218 of the device region 202 of the semiconductor device 200. FIGS. 4A-4C are illustrated from the perspective of the cross-sectional plane A-A in FIG. 2 for the device region 202. In some implementations, the operations described in connection with the example implementation 400 are performed after the fin formation process described in connection with FIGS. 3A-3D.

As shown in FIG. 4A, dummy gate structures 210 are formed in the device region 202. The dummy gate structures 210 are formed and included over the fin structures 206, and around the sides of the fin structures 206 such that the dummy gate structures 210 surround the fin structure 206 on at least three sides of the fin structure 206. The dummy gate structures 210 are formed as placeholders for the actual gate structures (e.g., replacement high-k gate structures or metal gate structures) that are to be formed for the transistors included in the device region 202. The dummy gate structures 210 may be formed as part of a replacement gate process, which enables other layers and/or structures to be formed prior to formation of the replacement gate structures.

The dummy gate structures 210 include gate dielectric layers 212, gate electrode layers 214, and hard mask layers 216. The gate dielectric layers 212 may each include dielectric oxide layers. As an example, the gate dielectric layers 212 may each be formed (e.g., by the deposition tool 102) by chemical oxidation, thermal oxidation, ALD, CVD, and/or other suitable methods. The gate electrode layers 214 may each include a poly-silicon layer or other suitable layers. For example, the gate electrode layers 214 may be formed (e.g., by the deposition tool 102) by suitable deposition processes such as LPCVD or PECVD, among other examples. The hard mask layers 216 may each include any material suitable to pattern the gate electrode layers 214 with particular dimensions and/or attributes. Examples include silicon nitride, silicon oxynitride, silicon carbon nitride, or a combination thereof, among other examples. The hard mask layers 216 may be deposited (e.g., by the deposition tool 102) by CVD, PVD, ALD, or another deposition technique.

As further shown in FIG. 4A, spacer layers 402 are included on the sidewalls of the dummy gate structures 210. The spacer layers 402 may be conformally deposited (e.g., by the deposition tool 102) and may include a silicon oxycarbide (SiOC), a nitrogen free SiOC, or another suitable material. The spacer layers 402 may be formed by an ALD operation in which various types of precursor gases including silicon (Si) and carbon (C) are sequentially supplied in a plurality of alternating cycles to form the spacer layers 402, among other example deposition techniques.

In some implementations, the spacer layers 402 include a plurality of types of spacer layers. For example, the spacer layers 402 may include a seal spacer layer that is formed on the sidewalls of the dummy gate structures 210 and a bulk spacer layer that is formed on the seal spacer layer. The seal spacer layer and the bulk spacer layer may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer.

In some implementations, the spacer layers 402 are conformally deposited (e.g., by the deposition tool 102) on the dummy gate structures 210, and on the fin structures 206. The spacer layers 402 are then patterned (e.g., by the deposition tool 102, the exposure tool 104, and the developer tool 106) and etched (e.g., by the etch tool 108) to remove the spacer layers 402 from tops of the dummy gate structures 210 and from the fin structures 206.

As shown in FIG. 4B, recesses 404 are formed in the fin structures 206 in the device region 202 between the dummy gate structures 210 in an etch operation. The etch operation may be performed by the etch tool 108 and may be referred to a first strained source/drain (SSD) etch operation, and the recesses 404 may be referred to as strained source/drain recesses. In some implementations, the first etch operation includes a plasma etch technique, a wet chemical etch technique, and/or another type of etch technique.

In some implementations, a plurality of etch operations are performed to form recesses 404 for different types of transistors. For example, a photoresist layer may be formed over and/or on a first portion of the fin structures 206 and over and/or on a first subset of the dummy gate structures 210 such that a second portion of the fin structures 206 between a second subset of the dummy gate structures 210 may be etched such that p-type source/drain regions and n-type source/drain regions may be formed in separate epitaxial operations.

As shown in FIG. 4C, source/drain regions 406 are formed in the recesses 404 in the device region 202 of the semiconductor device 200 over the substrate 204. The deposition tool 102 forms the source/drain regions 406 by an epitaxial operation, in which layers of the epitaxial material are deposited in the recesses 404 such that the layers of p-type source/drain regions and/or layers of n-type source/drain regions are formed by epitaxial growth in a particular crystalline orientation. The source/drain regions 406 are included between the dummy gate structures 210 and at least partially below and/or lower than the dummy gate structures 210. Moreover, the source/drain regions 406 at least partially extend above a top surface of the fin structures 206.

The material (e.g., silicon (Si), gallium (Ga), or another type of semiconductor material) that is used to form the source/drain regions 406 may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) or germanium (Ge), among other examples. The resulting material of p-type source/drain regions include silicon germanium ($Si_xGe_{1-x}$, where x can be in a range from approximately 0 to approximately 100) or another type of p-doped semiconductor material. Examples of n-type dopants that may be used in the epitaxial operation include phosphorous (P) or arsenic (As), among other examples. The resulting material of n-type source/drain regions include silicon phosphide ($Si_xP_y$) or another type of n-doped semiconductor material.

As indicated above, FIGS. 4A-4C are provided as an example. Other examples may differ from what is described with regard to FIGS. 4A-4C.

Figure 5A:
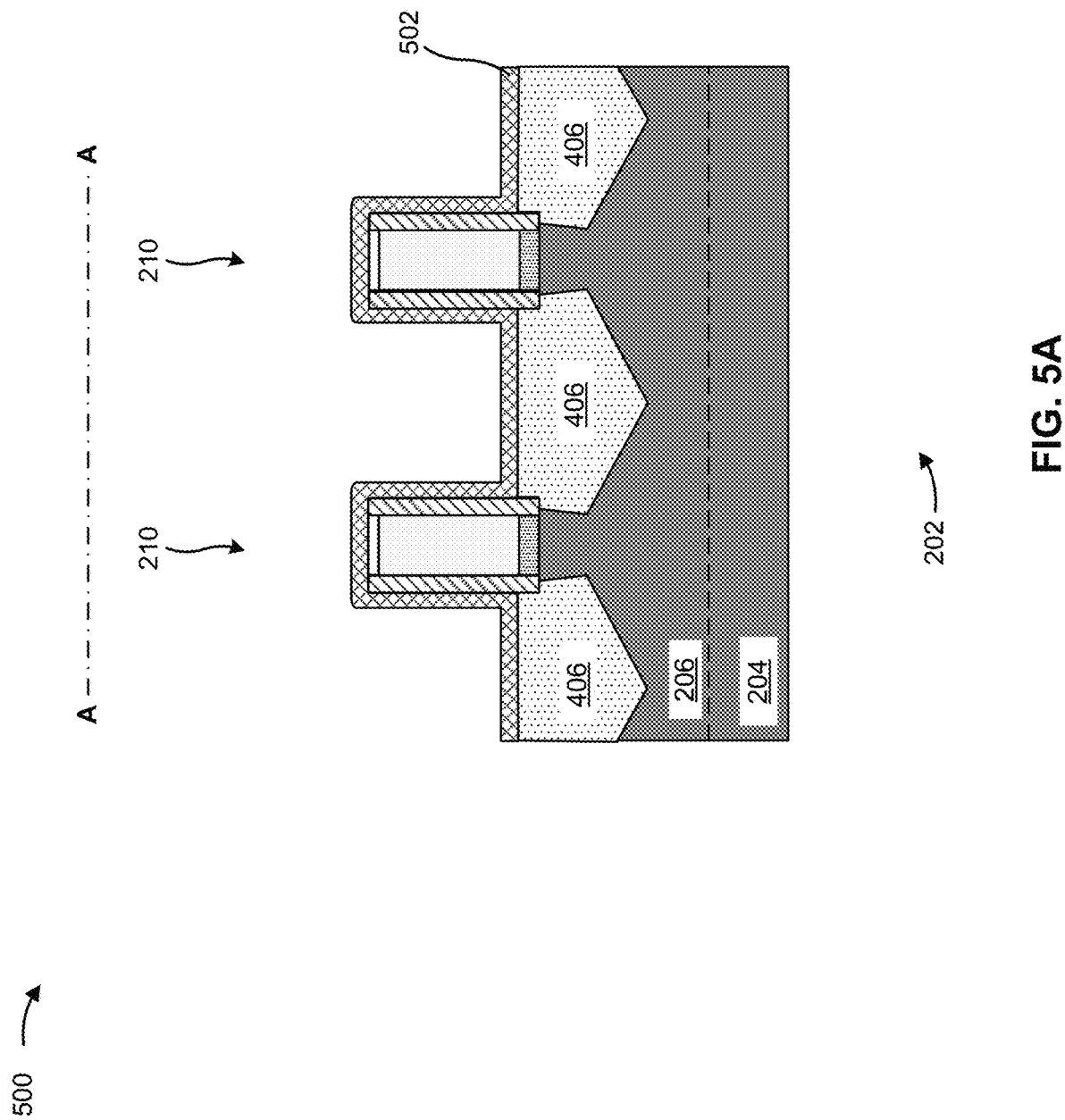
Figure 5B:
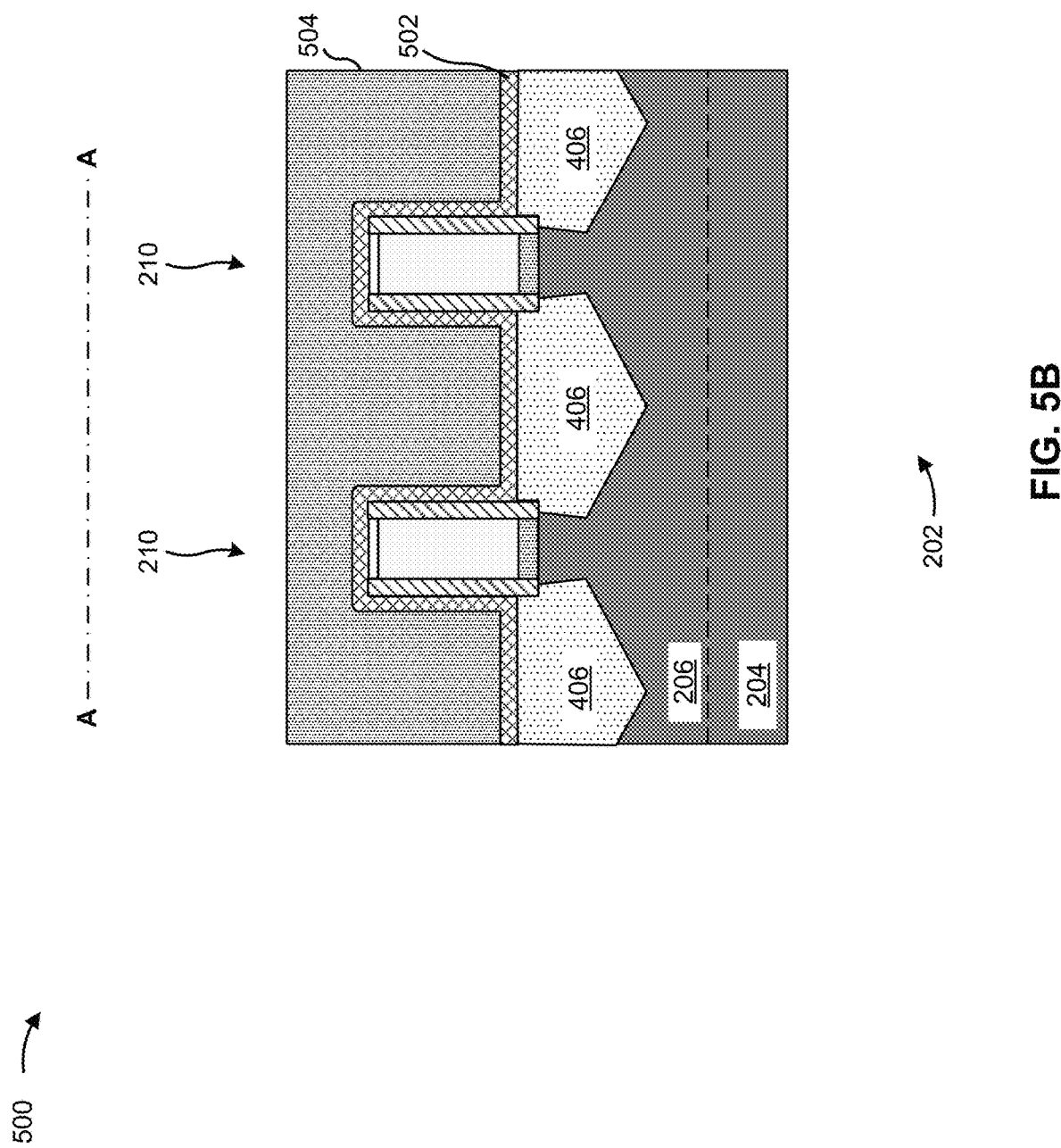
Figure 5C:
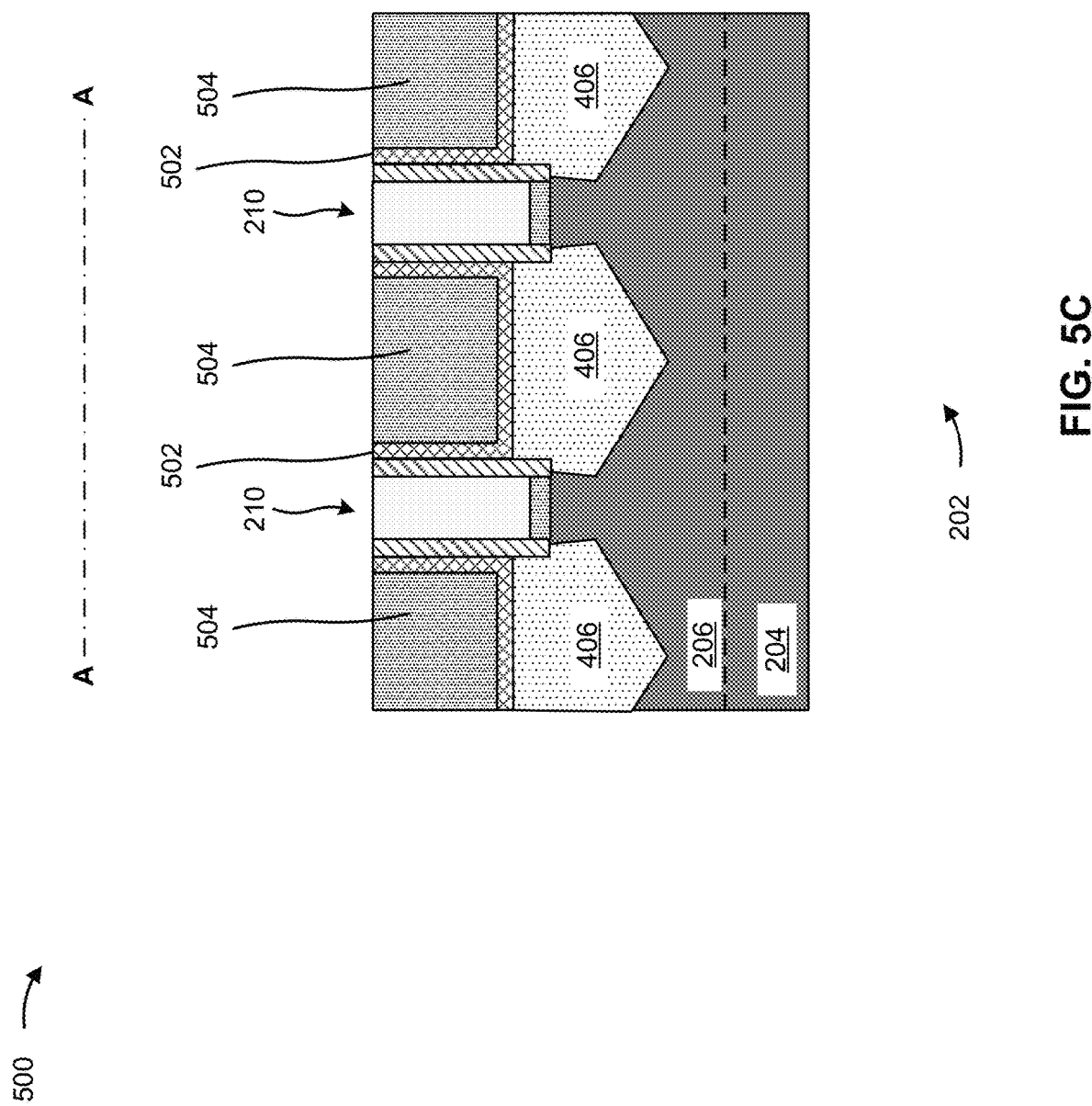
Figure 5D:
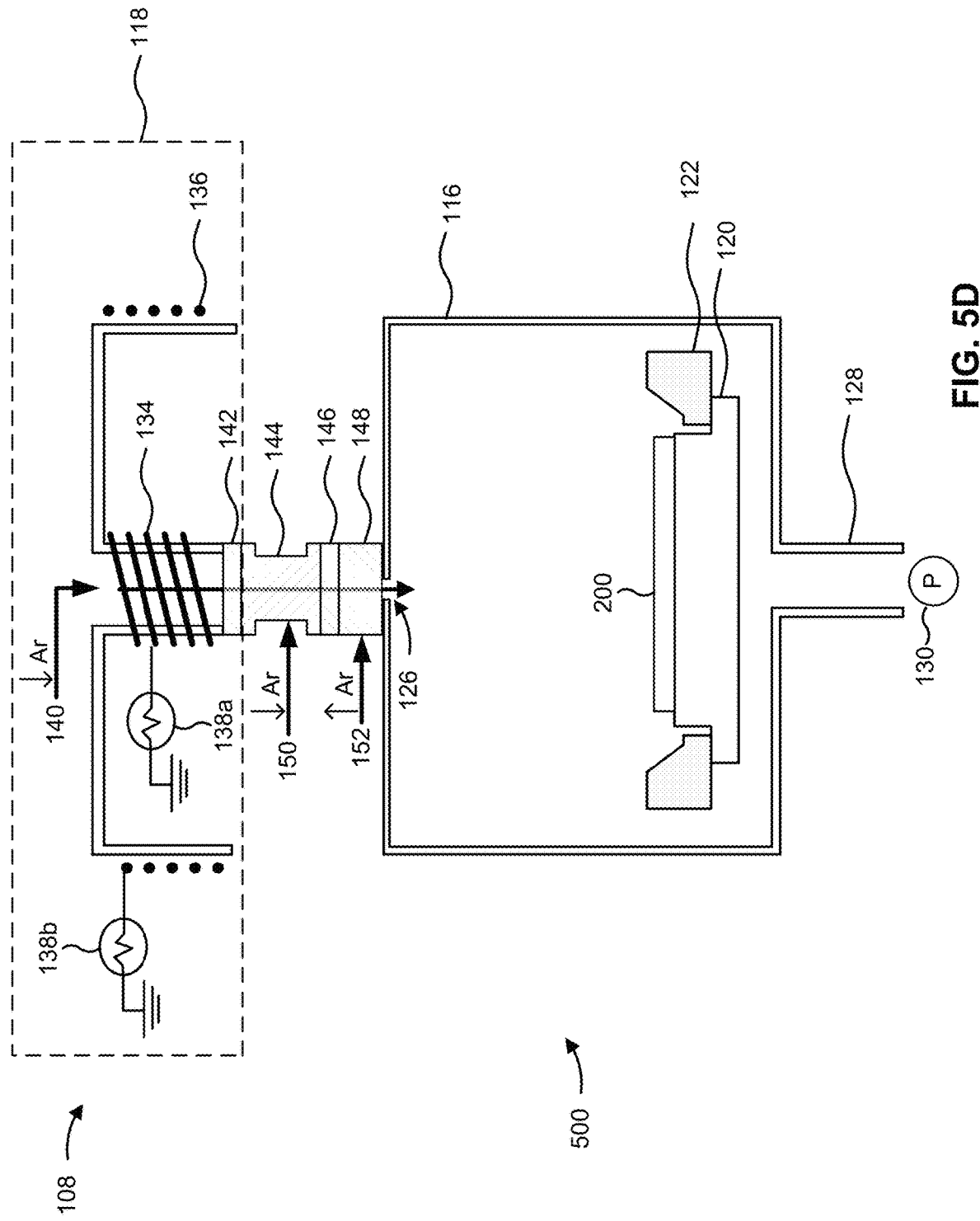
Figure 5E:
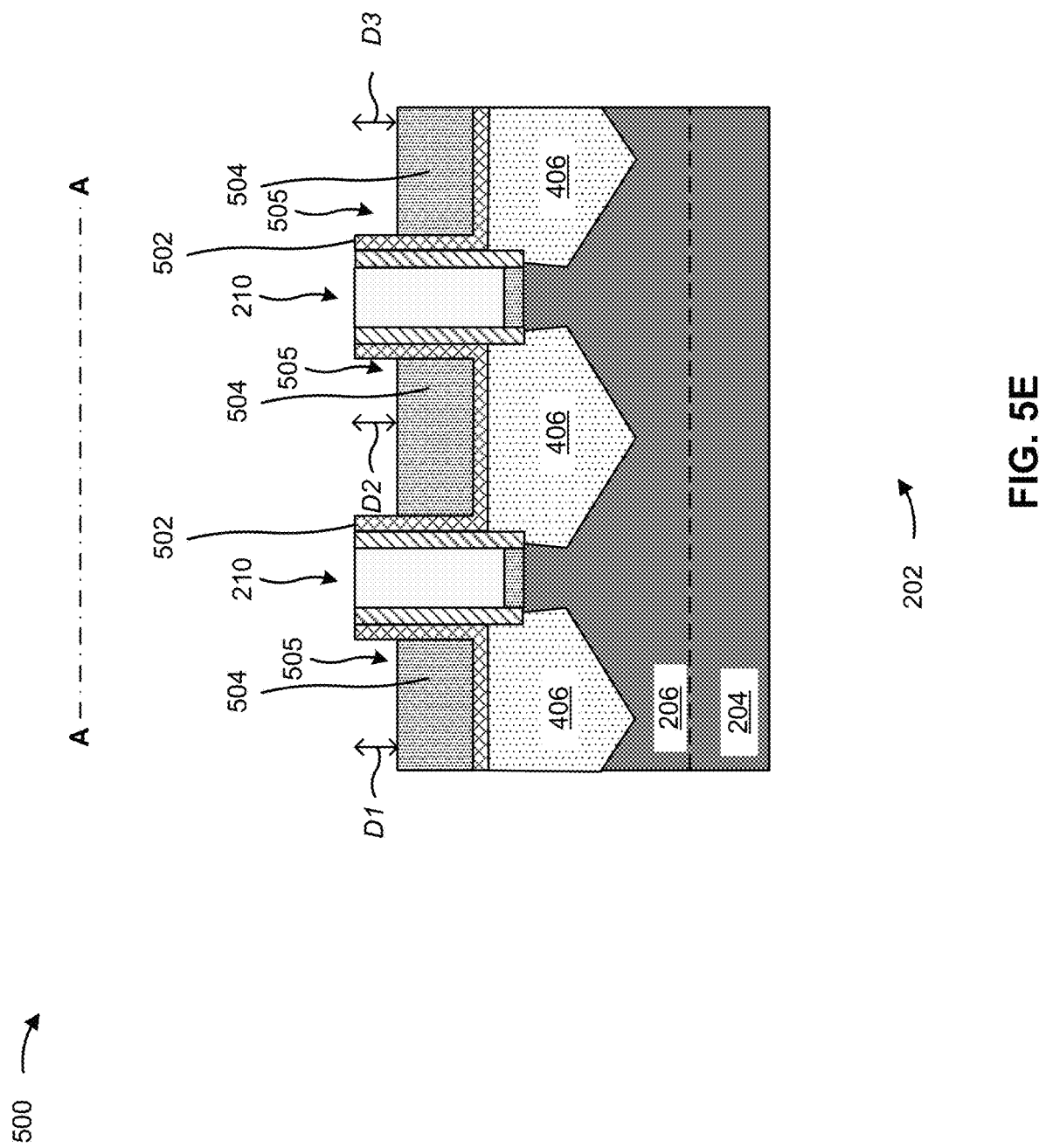
Figure 5F:
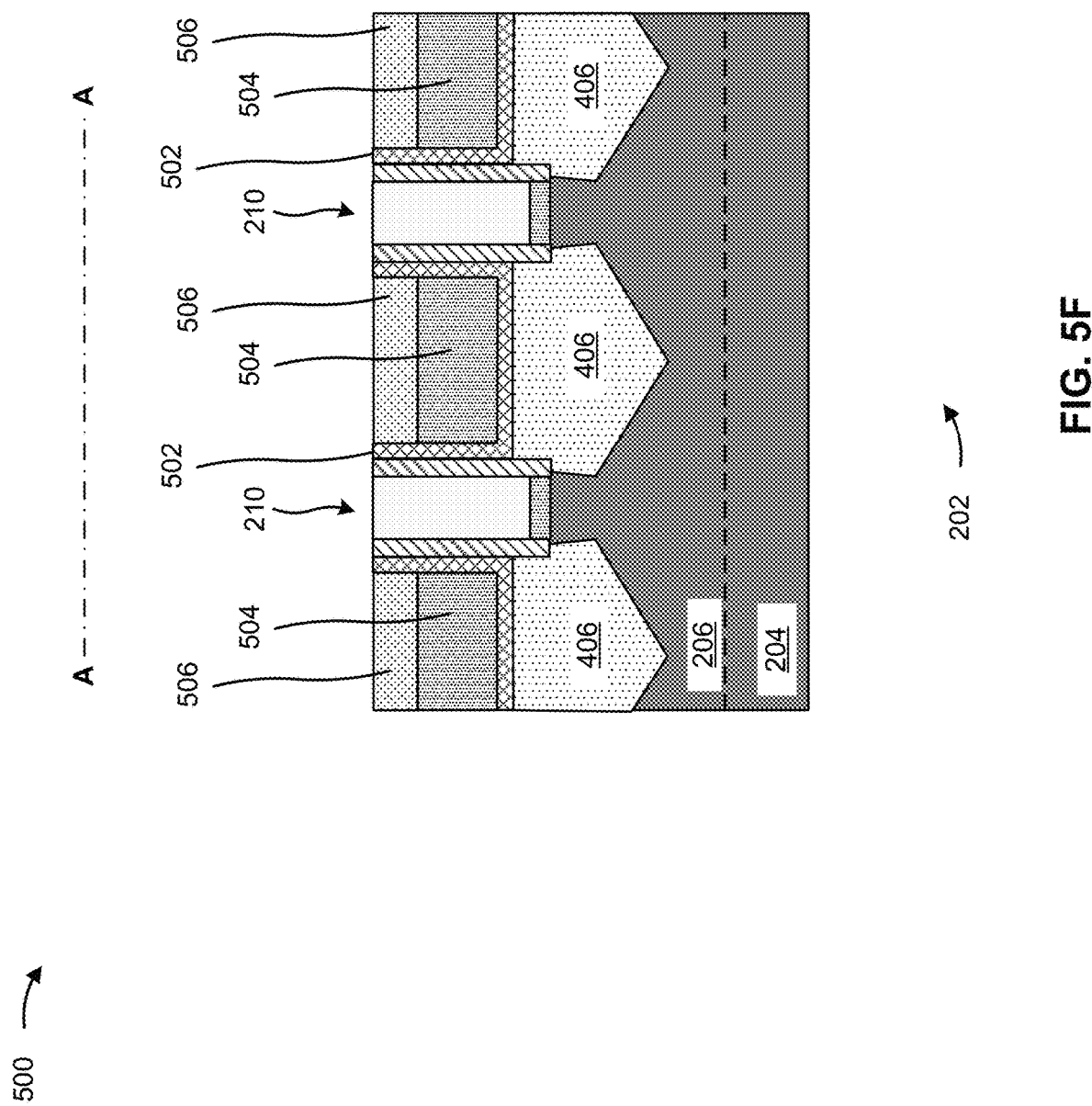
Figure 5G:
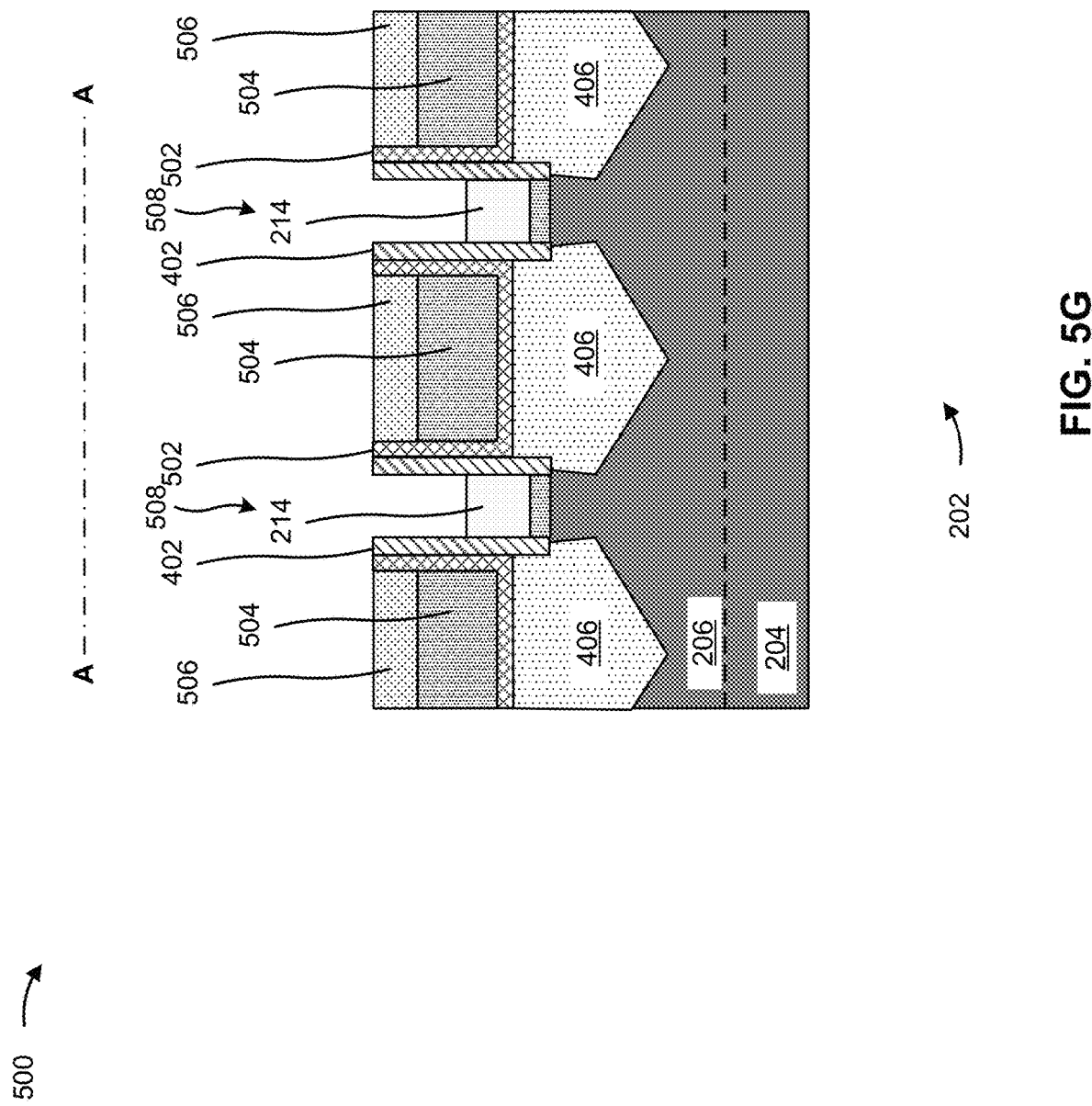
Figure 5H:
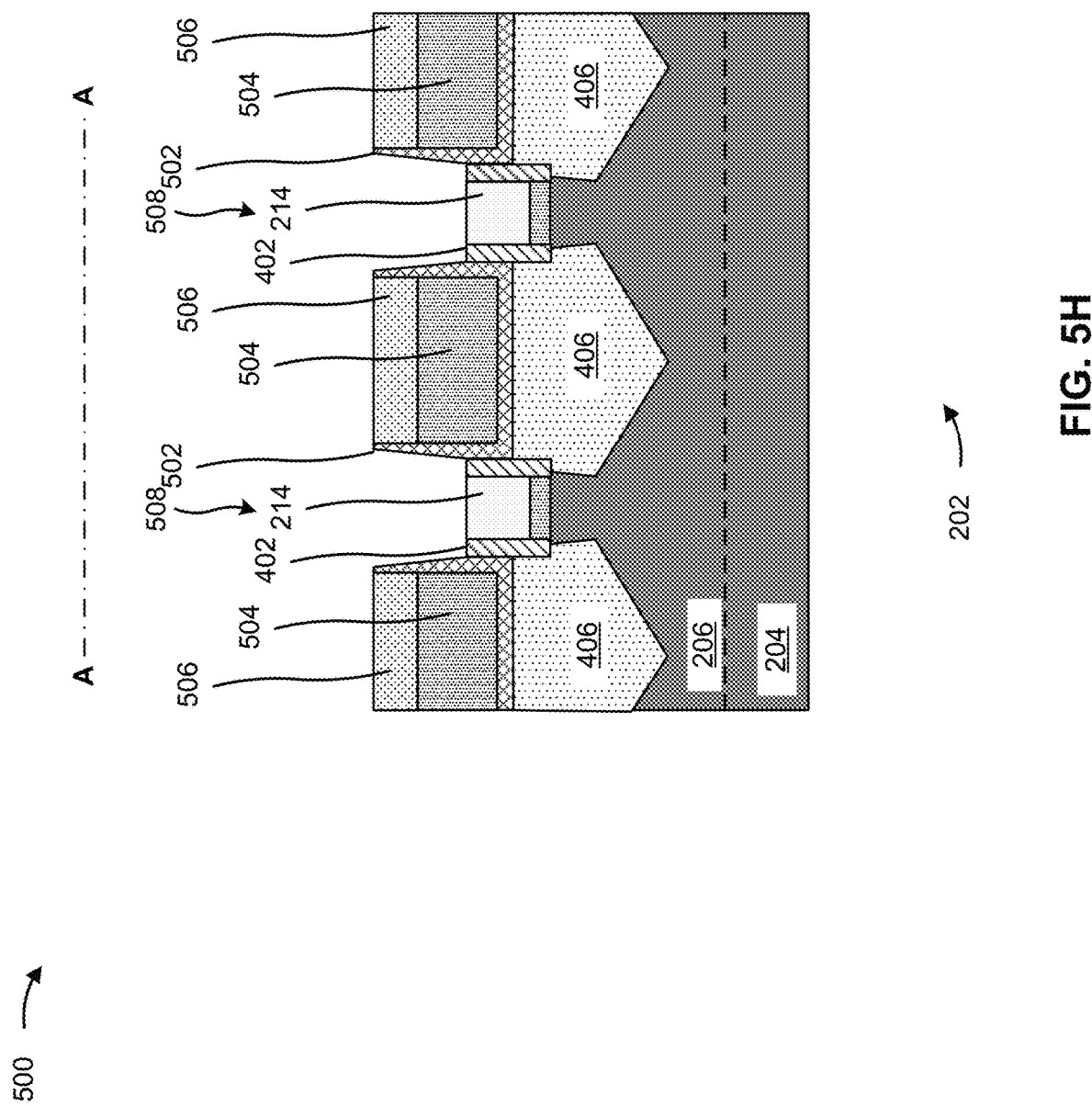
Figure 5I:
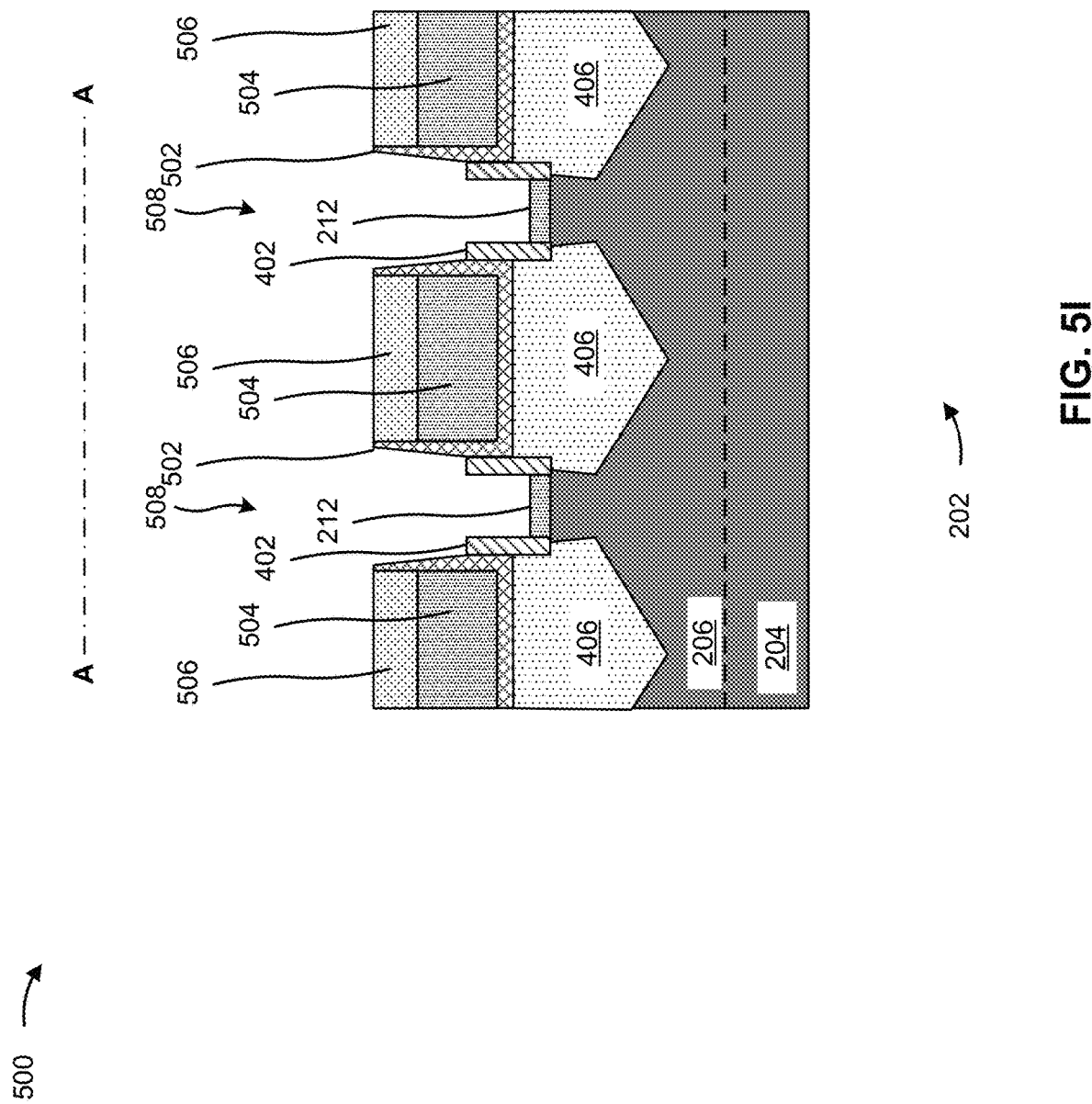
Figure 5J:
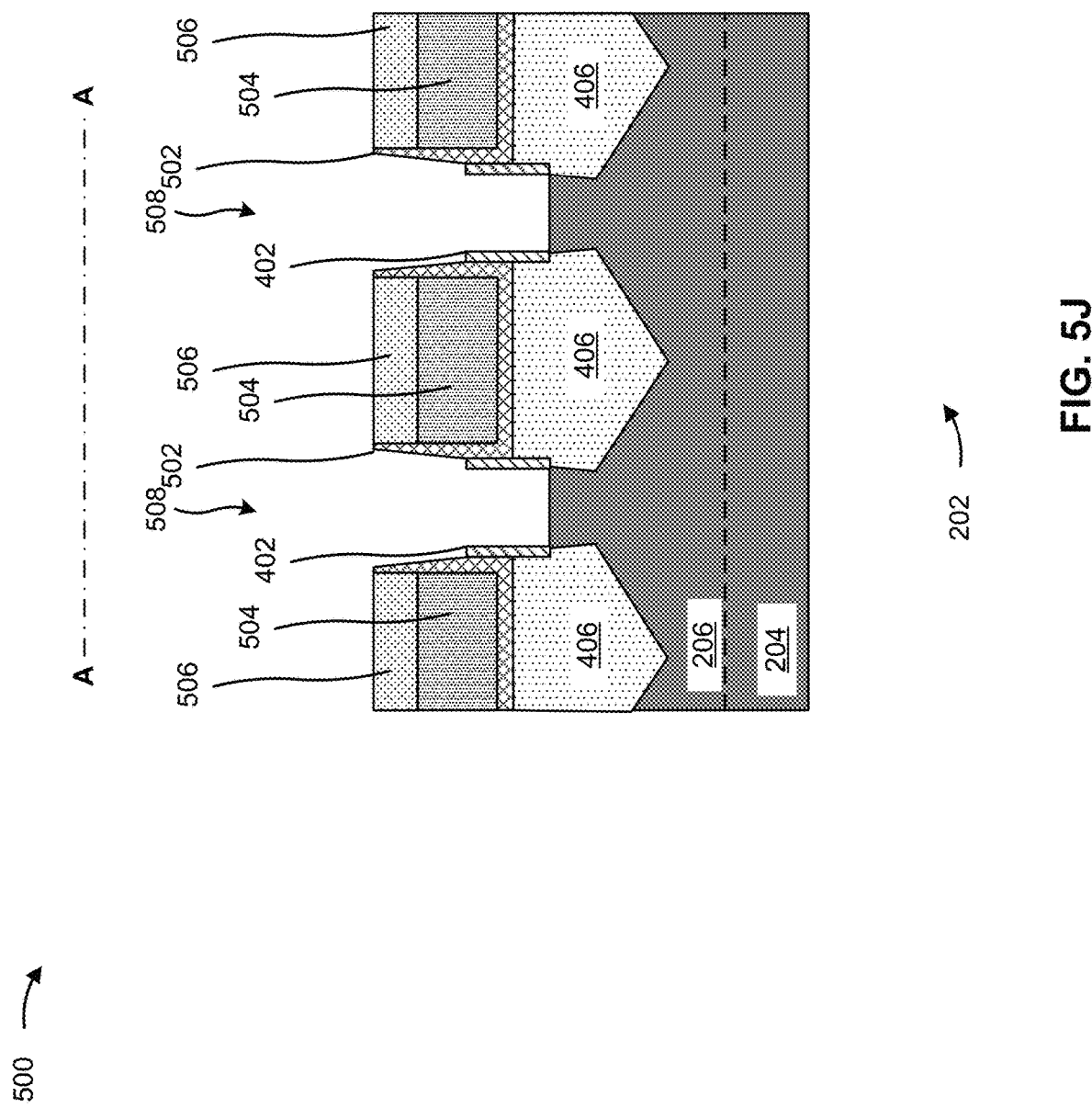
Figure 5K:
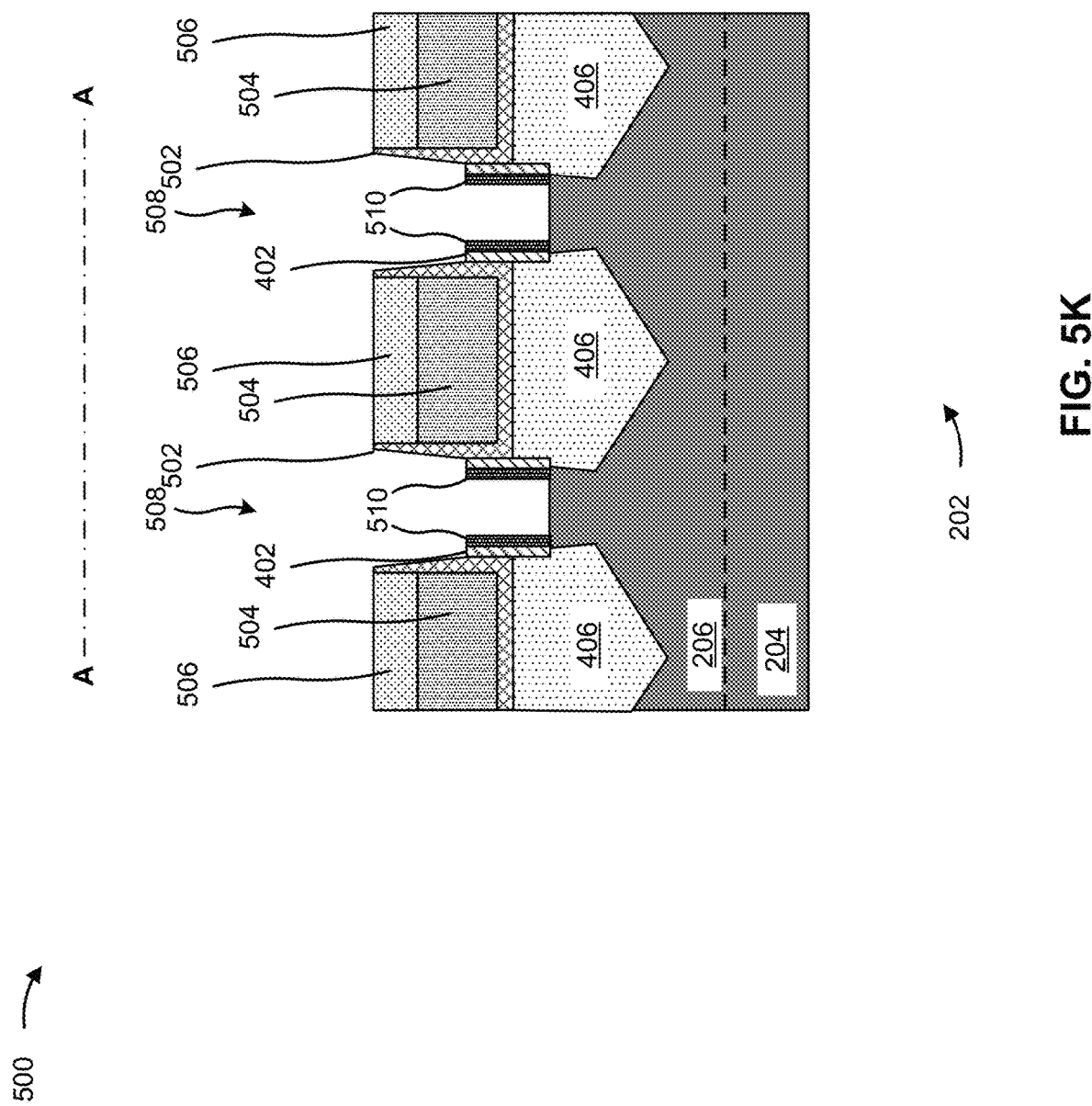
Figure 5L:
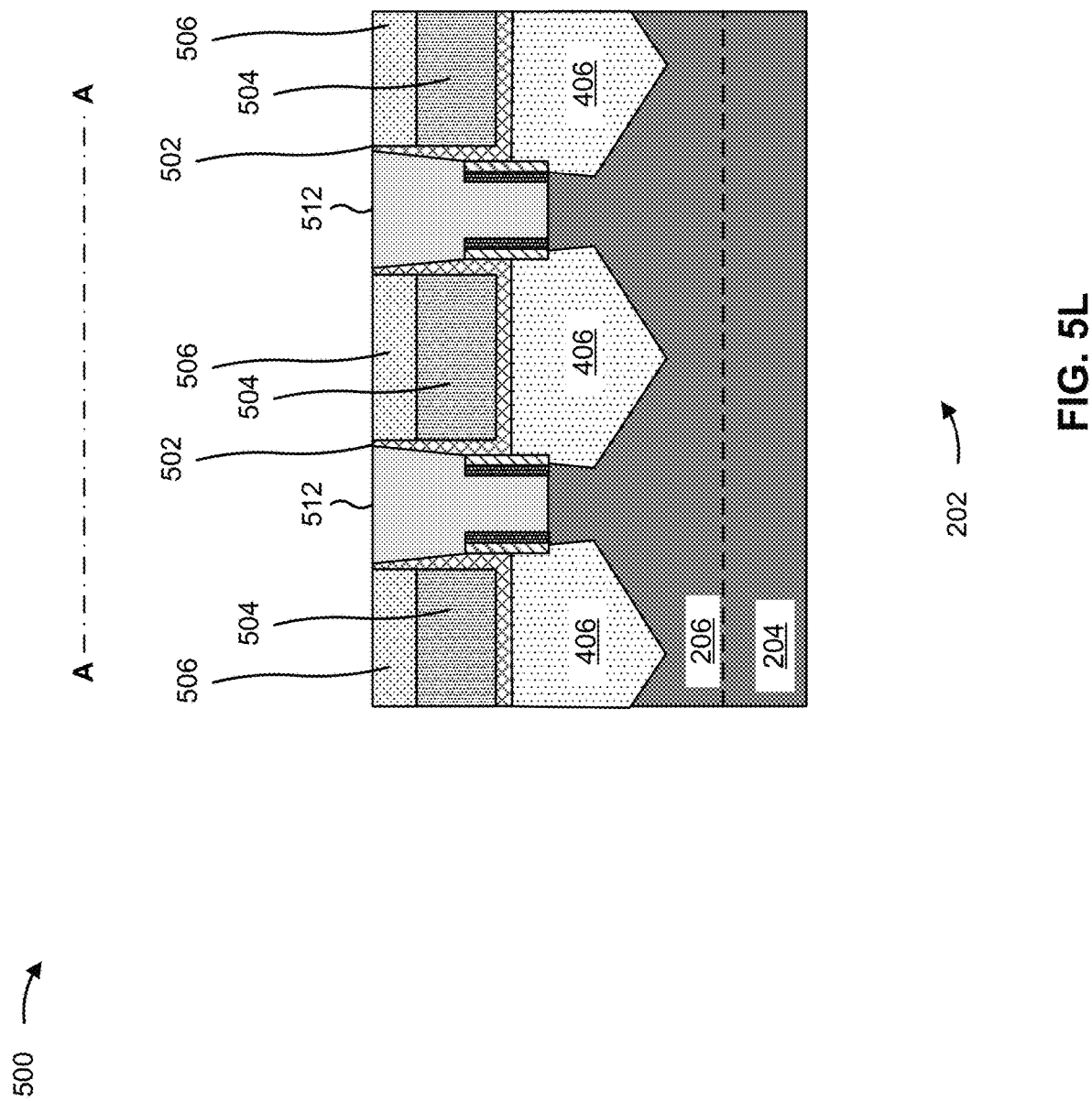
Figure 5N:
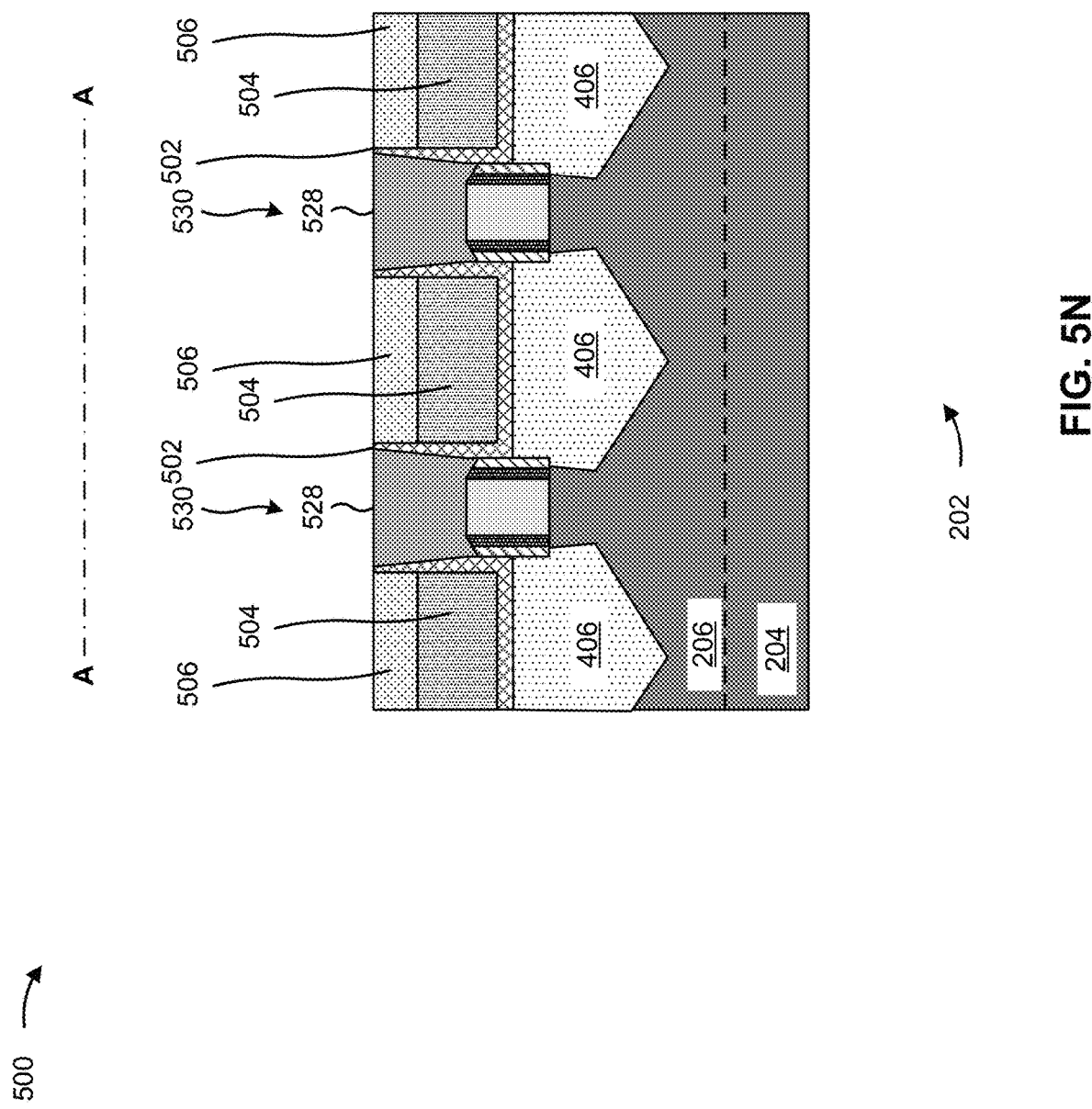
Figure 5O:
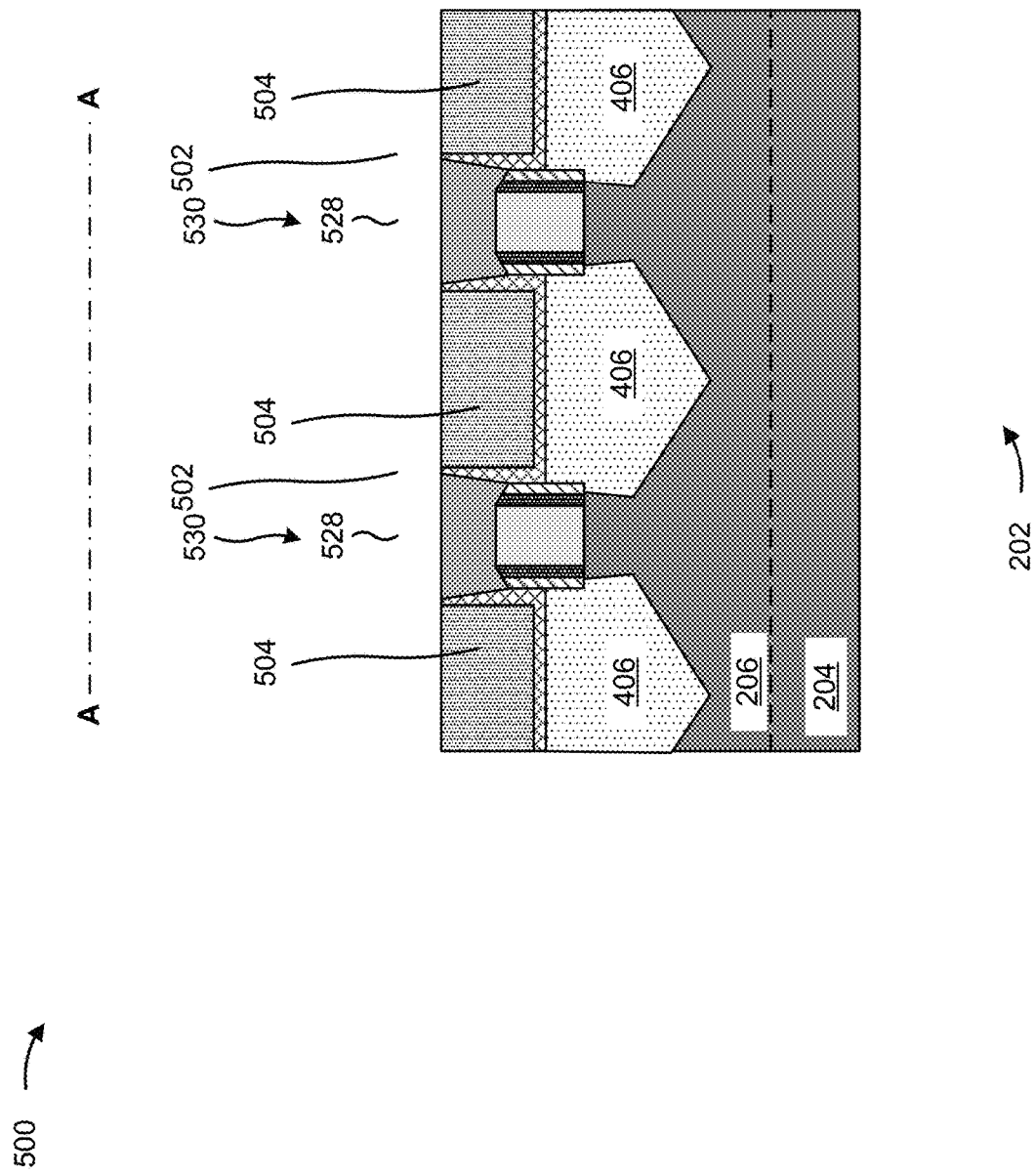

FIGS. 5A-5O are diagrams of an example implementation 500 described herein. The example implementation 500 includes an example dummy gate replacement process (also referred to as a replacement gate process (RGP)), in which the dummy gate structures 210 (which may be polysilicon (PO) based) are replaced with replacement gate structures that include high-k gate structures and/or metal gate structures, among other examples. FIGS. 5A-5O are illustrated from the perspective of the cross-sectional plane A-A in FIG. 2 for the device region 202.

As shown in FIG. 5A, a contact etch stop layer (CESL) 502 is conformally deposited (e.g., by the deposition tool 102) over the source/drain regions 406, over the dummy gate structures 210, and on the sidewalls of the spacer layers 402. The CESL 502 may provide a mechanism to stop an etch process when forming contacts or vias for the device region 202. The CESL 502 may be formed of a dielectric material having a different etch selectivity from adjacent layers or components. The CESL 502 may include or may be a nitrogen containing material, a silicon containing material, and/or a carbon containing material. Furthermore, the CESL 502 may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL 502 may be deposited using a deposition process, such as ALD, CVD, or another deposition technique. In some implementations, the CESL 502 is formed to a thickness in a range of approximately 50 nanometers to approximately 90 nanometers. However, other values for the thickness are within the scope of the present disclosure.

As shown in FIG. 5B, an interlayer dielectric (ILD) layer 504 is formed (e.g., by the deposition tool 102) over and/or on the CESL 502. The ILD layer 504 fills in the areas between the dummy gate structures 210 over the source/drain regions 406. The ILD layer 504 is formed to permit a replacement gate structure process to be performed in the device region 202, in which a metal gate structure is formed to replace one or more of the dummy gate structures 210. The ILD layer 504 may be referred to as an ILD zero (ILD0) layer.

In some implementations, the ILD layer 504 is formed to a height (or thickness) such that the ILD layer 504 covers the dummy gate structures 210. In these implementations, a subsequent CMP operation (e.g., performed by the planarization tool 110) is performed to planarize the ILD layer 504 such that a top surface of the ILD layer 504 is approximately at a same height as the top surfaces of the dummy gate structures 210. This increases the uniformity of the ILD layer 504.

As shown in FIG. 5C, the planarization tool 110 performs a planarization operation (e.g., a CMP operation) to planarize or polish the semiconductor device 200. The planarization operation results in removal of material from the hard mask layer 216, the spacer layers 402, the CESL 502, the ILD layer 504, and/or another layer. The planarization operation may be performed to expose the top surfaces of the dummy gate structures 210. The planarization operation may be referred to as an ILD0 oxide polish operation.

As shown in FIGS. 5D and 5E, the etch tool 108 is used to remove a portion of the ILD layer 504 to form recesses 505 in portions of the ILD layer 504 (e.g., portions of the ILD layer 504 over the source/drain regions 406). The removal of the portion of the ILD layer 504 may be referred to as a C0 recess operation. In some implementations, a single portion of the ILD layer 504 is etched over a single source/drain region 406 of the semiconductor device 200. In some implementations, a plurality of portions of the ILD layer 504 are etched over an associated plurality of source/drain regions 406 of the semiconductor device 200. The portion(s) of the ILD layer 504 may be etched to form the recess(es) 505 in preparation for filling the recess(es) with a capping layer that are to protect the ILD layer 504 in subsequent semiconductor processing operations for the semiconductor device 200.

In some implementations, a pattern in a photoresist layer is used to remove the portion of the ILD layer 504. In these implementations, the deposition tool 102 forms the photoresist layer on the ILD layer 504 and on the dummy gate structures 210. The exposure tool 104 exposes the photoresist layer to a radiation source to pattern the photoresist layer. The developer tool 106 develops and removes portions of the photoresist layer to expose the pattern. The etch tool 108 etches into the ILD layer 504 to remove the portion of the ILD layer 504. In some implementations, a photoresist removal tool removes the remaining portions of the photoresist layer (e.g., using a chemical stripper, plasma ashing, and/or another technique). In some implementations, a hard mask layer is used as an alternative technique to remove the portion of the ILD layer 504. In some implementations, the portion of the ILD layer 504 is removed based on a difference in etch selectivity (e.g., without a photoresist layer) between the materials of the dummy gate structures 210 and the materials of the ILD layer 504.

As shown in FIG. 5D, the semiconductor device 200 is placed on the chuck 120 in the processing chamber 116 of the etch tool 108. The etch tool 108 performs a dry etch operation without the use of a plasma to form the recesses 505 in the portions of the ILD layer 504. In these implementations, the etch tool 108 uses one or more etchants to etch or remove the portions of the ILD layer 504 to form the recesses 505. A first etchant (e.g., hydrofluoric acid (HF)) is provided into the mixing manifold 148 (e.g., directly into the mixing manifold 148) through the gas inlet 152. The first etchant may be provided into the mixing manifold 148 using a first carrier gas such as argon (Ar) or another inert gas. A second etchant (e.g., ammonia ($NH_3$)) is provided into the mixing manifold 148 from the gas inlet 150 and through the inlet adapter 144 and the diffuser plate 146. The second etchant may be provided into the mixing manifold 148 using a second carrier gas such as argon (Ar) or another inert gas. The first etchant and the second etchant are mixed in the mixing manifold (and may react with each other in the mixing manifold) to form or generate an etchant mixture. A third carrier gas, such as argon (Ar) or another inert gas, is provided to the mixing manifold 148 to facilitate a flow of the etchant mixture from the mixing manifold 148 to the processing chamber 116 through the inlet port 126. The third carrier gas may be provided from the gas inlet 140 in the RPS 118 and through the RPS insulator 142, the inlet adapter 144, and the diffuser plate 146. The flow of the third carrier gas may also be provided to resist backflow of gas (e.g., of the etchant mixture, of the etchants, of the carrier gases) to the RPS 118.

The etchant mixture is provided from the mixing manifold 148 to the processing chamber 116 through the inlet port 126. The etchant mixture is provided to the processing chamber 116 and dispersed and/or distributed across the semiconductor device 200 to remove the portions of the ILD layer 504 to form the recesses 505.

The flow rates and/or concentrations of carrier gases provided into the etch tool 108 through the gas inlets 140, 150, and 152 may be configured to increase uniformity of and/or promote uniform distribution of the etchant mixture across the semiconductor device 200. Moreover, flow rates and/or concentrations of carrier gases provided into the etch tool 108 through the gas inlets 140, 150, and 152 may be configured to promote, facilitate, and/or increase mixing of the etchants in the mixing manifold 148 and to promote uniform distribution of the etchants in the etchant mixture and in the mixing manifold 148.

In particular, the flow rate of the carrier gas at the gas inlet 152 may be greater relative to the flow rate of the carrier gas at the gas inlets 140 and 150. If the flow rates of the carrier gas at the gas inlets 140 and/or 150 are too high relative to the flow rate of the carrier gas at the gas inlet 152, the etchant mixture will be pushed into the processing chamber 116 before the etchants can fully mix and uniformly distribute in the etchant mixture. In particular, the flow rates of the carrier gas at the gas inlets 140 and/or 150 are too high relative to the flow rate of the carrier gas at the gas inlet 152, the etchants may not be permitted to distributed to a side of the mixing manifold 148 opposing the side in which the gas inlet 152 is located. This might otherwise result in a gradient of etchant concentration in the processing chamber 116 and uneven etching of the portions of the ILD layer 504. The gradient, for example, might occur such that etchant concentration is greatest near the side of the mixing manifold 148 in which the gas inlet 152 is located, and such that the etchant concentration is lowest near the side of the mixing manifold 148 opposing the side in which the gas inlet 152 is located, and such that the etchant concentration tapers off or reduces from the side in which the gas inlet 152 is located to the opposite side. The flow rate of the carrier gas at the gas inlet 152 being greater relative to the flow rate of the carrier gas at the gas inlets 140 and 150 promotes distribution of etchants in a mixing manifold 148 in that the etchants are permitted to mix in the mixing manifold 148 before the etchant mixture is provided to the processing chamber 116. This prevents, minimizes, and/or otherwise reduces the above-described etchant gradient, or reduces the likelihood of the above-described etchant gradient from occurring. Accordingly, the concentration and/or distribution of etchants in the mixing manifold 148 may be approximately even and/or consistent between side of the mixing manifold 148 in which the gas inlet 152 is located and the side of the mixing manifold 148 opposing the side in which the gas inlet 152 is located.

In some implementations, the flow rate of the carrier gas at the gas inlet 150 is greater relative to the flow rate of the carrier gas at the gas inlet 140. In some implementations, the flow rate of the carrier gas at the gas inlet 150 is lesser relative to the flow rate of the carrier gas at the gas inlet 140.

The flow rate of the carrier gas at the gas inlet 152 may be in a range of approximately 1700 standard cubic centimeters per minute (sccm) to approximately 2150 sccm, and/or the ratio of the etchant provided through the gas inlet 152 to the carrier gas may be in a range of approximately 23/100 to approximately 7/25, to promote, facilitate, and/or increase uniformity of etchant distribution and uniformity of depths of the recesses 505 and to maintain sufficient dosage accuracy for the etchant. However, other values for the ranges are within the scope of the present disclosure.

The flow rate of the carrier gas at the gas inlet 150 may be in a range of approximately 400 sccm to approximately 1000 sccm, and/or the ratio of the etchant provided through the gas inlet 150 to the carrier gas may be in a range of approximately 2/25 to approximately 3/25, to promote, facilitate, and/or increase uniformity of etchant distribution and uniformity of depths of the recesses 505 and to provide sufficient carrier gas supply to deliver the etchant to the mixing manifold 148. However, other values for the ranges are within the scope of the present disclosure.

The flow rate of the carrier gas at the gas inlet 140 may be in a range of approximately 400 sccm to approximately 1400 sccm to promote, facilitate, and/or increase uniformity of etchant distribution and uniformity of depths of the recesses 505 and to provide sufficient etchant backflow protection. However, other values for the range are within the scope of the present disclosure.

In some implementations, a ratio of the gas flow of the carrier gas at the gas inlet 152 to the gas flow of the carrier gas at the gas inlet 150 is in a range of approximately 1.7:1 to approximately 5.375:1 to promote, facilitate, and/or increase uniformity of etchant distribution and uniformity of depths of the recesses 505 and to maintain an appropriate concentration of the etchants in the etchant mixture. However, other values for the ranges are within the scope of the present disclosure. In some implementations, a ratio of the gas flow of the carrier gas at the gas inlet 152 to the gas flow of the carrier gas at the gas inlet 140 is in a range of approximately 1.21:1 to approximately 5.375:1 to promote, facilitate, and/or increase uniformity of etchant distribution and uniformity of depths of the recesses 505 and to sufficient backflow protection. However, other values for the ranges are within the scope of the present disclosure. In some implementations, a ratio of the gas flow of the carrier gas at the gas inlet 150 to the gas flow of the carrier gas at the gas inlet 140 is in a range of approximately 0.29:1 to approximately 2.5:1 to promote, facilitate, and/or increase uniformity of etchant distribution and uniformity of depths of the recesses 505 and to sufficient backflow protection. However, other values for the ranges are within the scope of the present disclosure.

In some implementations, the flow rates of the carrier gasses at the gas inlets 140, 150, and/or 152 may be adjusted (e.g., prior to operation of the etch tool 108, dynamically during operation of the etch tool 108, and/or after operation of the etch tool 108, among other examples) to achieve one or more processing parameters for the semiconductor device 200. For example, the flow rates of the carrier gasses at the gas inlets 140, 150, and/or 152 may be adjusted to achieve a particular etchant mixture uniformity in the processing chamber 116 (e.g., to eliminate etchant mixture gradients and to provide a substantially even distribution of the etchant mixture in the processing chamber 116).

As another example, the flow rates of the carrier gasses at the gas inlets 140, 150, and/or 152 may be adjusted using a machine learning model to achieve uniformity of etch depth for the recesses 505 and/or to achieve uniformity of thickness of a capping layer that is to be formed in the recesses 505. In some implementations, a controller (e.g., a controller of the etch tool 108, a controller of another computing system, a device 700 depicted in FIG. 7) uses the machine learning model to adjust the flow rates of the carrier gasses at the gas inlets 140, 150, and/or 152 by providing candidate gas flow rates as input to the machine learning model, and using the machine learning model to determine a likelihood, probability, or confidence that a particular outcome (e.g., a particular uniformity threshold for etchants in the etchant mixture, a particular uniformity of depths of the recesses 505, a particular depth range for the recesses 505) for the etch operation will be achieved using the candidate gas flow rates. In some implementations, the controller provides a desired outcome (e.g., a particular uniformity threshold for etchants in the etchant mixture, a particular uniformity of depths of the recesses 505, a particular depth range for the recesses 505) for the etch operation as input to the machine learning model, and the controller uses the machine learning model to determine or identify a particular combination of flow rates of the carrier gasses at the gas inlets 140, 150, and/or 152 that are likely to achieve the desired outcome.

The controller (or another system) may train, update, and/or refine the machine learning model to increase the accuracy of the outcomes and/or parameters determined using the machine learning model. The controller may train, update, and/or refine the machine learning model based on feedback and/or results from the subsequent C0 recess operations, as well as from historical or related C0 recess operations (e.g., from hundreds, thousands, or more historical or related C0 recess operations) performed by the etch tool 108.

As shown in FIG. 5E, the flow rates and/or concentrations of carrier gases described above promote uniformity of depth (e.g., etching depth) of the recesses 505 that are formed in the portions of the ILD layer 504. In particular, the flow rates and/or concentrations of carrier gases described above promote uniformity of depths D1, D2, and D3 (and other recess depths of the recesses 505), among other examples. For example, the flow rates and/or concentrations of carrier gases described above enable the recesses 505 to be formed such that the variation or differences in depths of the recesses (e.g., the variation in the depths D1, D2, and D3) are in a range of approximately 13.5 angstroms (1.35 nanometers) to approximately 17 angstroms (1.7 angstroms). This range of variation may reduce the likelihood of portions of capping layers, formed in the recesses 505, remaining after a planarization operation to remove the capping layers and/or reduces the likelihood of dishing and/or void formation in the portions of the ILD layer 504. Accordingly, this range may reduce etching of adjacent SACs of the semiconductor device 200, which decreases gate height loading of the semiconductor device 200 and/or decreases a likelihood of metal gate damage and/or de-footing in the semiconductor device 200. However, other values for the range are within the scope of the present disclosure.

In some implementations, one or more operations may be performed for the semiconductor device 200 between the planarization operation of FIG. 5C and the C0 recess operation of FIGS. 5D and 5E. For example, one or more operations may be performed to form one or more gate isolation regions in the semiconductor device 200. The gate isolation region(s) (which may also be referred to as cut gate regions, cut polysilicon regions, or cut poly regions, among other examples) may be formed to separate the dummy gate structures 210 into shorter or smaller portions of the dummy gate structures 210 so that individual or isolated replacement gate structures may be formed for respective transistors of the semiconductor device 200 when a gate replacement process is performed.

The one or more operations to form the gate isolation region(s) may include a cut polysilicon (CPO) operation and a continuous poly on oxide definition edge (CPODE) operation, among other examples. The CPO operation includes the etch tool 108 etching one or more portions of the dummy gate structures 210 to form openings or recesses in the dummy gate structures 210. The deposition tool 102 may deposit a dielectric material in the recesses or openings to form the gate isolation region(s). The dielectric material may include, for example, a silicon oxide ($SiO_x$), a silicon nitride ($Si_xN_y$), a silicon oxynitride (SiON), fluoride-doped silicate glass (FSG), a low-k dielectric material, and/or another suitable insulating material. The CPODE operation includes the etch tool 108 etching one or more portions of the dummy gate structures 210 and the fin structure 206 to form a trench. The deposition tool 102 may deposit a dielectric material in the trench to form a horizontally-orientated capacitor that isolates different regions of the semiconductor device 200 (e.g., different memory cells, different active regions). The dielectric material may include, for example, a silicon oxide ($SiO_x$), a silicon nitride ($Si_xN_y$), a silicon oxynitride (SiON), fluoride-doped silicate glass (FSG), a low-k dielectric material, and/or another suitable insulating material.

As shown in FIG. 5F, the recesses 505 in the ILD layer 504 are filled with a capping layer 506. The deposition tool 102 deposits the capping layer 506 using a CVD technique, a PVD technique, an ALD technique, another deposition technique described above in connection with FIG. 1A, and/or a deposition technique other than as described above in connection with FIG. 1A. The deposition tool 102 may over-fill the recesses 505 such that the capping layer 506 is initially formed to a height or thickness that is greater relative to the height of the top surfaces of the dummy gate structures 210. Accordingly, the planarization tool 110 may then perform a planarization operation to planarize or polish the capping layer 506 such that the height of a top surface of the capping layer 506 and the height of the top surfaces of the dummy gate structures 210 are approximately equal.

The thickness of the capping layer 506 may be highly uniform and approximately equal over the portions of the ILD layer 504. In particular, the etch techniques described above in connection with FIGS. 5D and 5E, and the configuration of the flow rates and/or concentrations of the carrier gasses at the gas inlets 140, 150, and 152 may promote and/or achieve uniformity of thickness of the capping layer 506 over the portions of the ILD layer 504. In some implementations, the thickness of the capping layer 506 over the portions of the ILD layer 504 may correspond to the depths D1, D2, and D3 (and other recess depths) of the recesses 505. In some implementations, the thickness of the capping layer 506 over the portions of the ILD layer 504 may be less than the depths D1, D2, and D3 due to planarization of the capping layer 506 after deposition of the material of the capping layer 506.

The capping layer 506 may be formed of a dielectric material. The dielectric material may include, for example, an oxide, a nitride, and/or another type of dielectric material. Examples include a silicon oxide ($SiO_x$), a silicon nitride ($Si_xN_y$), a silicon oxynitride (SiON), fluoride-doped silicate glass (FSG), a low-k dielectric material, and/or another suitable material. The dielectric material of the capping layer 506 and the material of the dummy gate structures 210 may be different to provide a difference in etch selectivity between the capping layer 506 and the dummy gate structures 210.

As shown in FIG. 5G, portions of the gate electrode layers 214 of the dummy gate structures 210 are removed in a polysilicon removal (PORM) operation. In some implementations, the etch tool 108 etches the gate electrode layers 214 to remove portions of the gate electrode layers 214 of the dummy gate structures 210 based on the difference in etch selectivity between the capping layer 506 and the gate electrode layers 214. Alternatively, a pattern in a hard mask or a photoresist layer may be formed, and the etch tool 108 may etch the gate electrode layers 214 based on the pattern.

As shown in FIG. 5H, portions of the spacer layers 402 are removed. In some implementations, the etch tool 108 etches the spacer layers 402 to remove the portions of the spacer layers 402. In some implementations, the spacer layers 402 are etched such that a height of top surfaces of the spacer layers 402 and top surfaces (e.g., heights) of the gate electrode layers 214 are approximately equal. In some implementations, top surfaces of the gate electrode layers 214 may be curved, dished, or concave as a result of the PORM operation. The gate electrode layers 214 may also be etched along with the spacer layers 402 to flatten the top surfaces of the spacer layers 402. In this way, the top surfaces of the gate electrode layers 214 and the spacer layers 402 are approximately flat and smooth between the CESL 502, as shown in the example in FIG. 5H.

The etch tool 108 may perform a plasma-based etch operation to etch the spacer layers 402 (and, in some implementations, the top surface of the gate electrode layers 214). The plasma-based etch operation may include a radical surface treatment (RST) in which a plasma is used to generate radicals. The radicals are used to etch the material of the spacer layers 402. The radicals may include, for example, fluorine (F) radicals, fluorine-containing radicals, hydrous radicals, nitrogen/hydrogen radicals, sulfur hydrogen radicals, and/or another type of radicals. The radicals may be generated by using the plasma to excite a gas mixture including a nitrogen fluoride ($NF_x$ such as $NF_3$), oxygen ($O_2$), and/or another gas. In some implementations, a quartz filter may be used to facilitate generation of radicals (e.g., fluorine ion radicals) from the gas mixture. In this way, the radicals are generated and provided to the semiconductor device 200 to achieve a high etch selectively for the material of the spacer layers 402 (e.g., a silicon nitride ($Si_xN_y$) or another suitable material) relative to other materials of the semiconductor device 200.

The plasma may include a nitrogen-based ($N_2$) plasma, a hydrogen-based ($H_2$) plasma, an argon-based (Ar) plasma and/or another type of plasma. The plasma may be generated by inductive coupling, capacitive coupling, transformer coupling, and/or another plasma generation technique. The pressure for the RST operation may be in a range of approximately 0.005 Torr to approximately 10 Torr. However, other values for the pressure are within the scope of the present disclosure. The temperature for the RST operation may be in a range of approximately 300 degrees Celsius to approximately 500 degrees Celsius. However, other values for the temperature are within the scope of the present disclosure. The radio frequency (RF) power for the plasma may be included in a range of approximately 100 watts to approximately 200 watts. However, other values for the RF power are within the scope of the present disclosure.

As further shown in FIG. 5H, the etch tool 108 may etch portions of the CESL 502 (e.g., portions of the CESL 502 in the openings 508) in the plasma-based etch operation. The portions of the CESL 502 may be etched to tune or configure a particular profile for the CESL 502 in the openings 508. The plasma-based etch operation may be used to tune or configure a bottom profile (or bottom width) for dielectric capping layers that are to be formed in the openings 508 in a subsequent operation, and/or to tune or configure a top profile (or top width) for dielectric capping layers that are to be formed in the openings 508 in a subsequent operation. Etching of the portions of the CESL 502 in the openings 508 results in the CESL 502 being angled or tapered between the top surfaces of the gate electrode layers 214 and top surfaces of the CESL 502, as shown in the example in FIG. 5H. This results in a funnel (or tapered) profile for the opening 508, which may enable formation of tapered or angled dielectric capping layers in the openings 508, which may increase the gap filling performance (e.g., with reduced void formation, reduced discontinuity formation, reduced delamination) in one or more subsequent deposition operations to form the dielectric capping layers.

As shown in FIG. 5I, the remaining portions of the gate electrode layers 214 are removed from the openings 508. The removal of the remaining portions of the gate electrode layers 214 exposes the gate dielectric layers 212. In some implementations, the etch tool 108 etches the gate electrode layers 214 to remove the remaining portions of the gate electrode layers 214 based on the difference in etch selectivity between the gate electrode layers 214 and the other layers and/or structures of the semiconductor device 200. Alternatively, a pattern in a hard mask or a photoresist layer may be formed, and the etch tool 108 may etch the gate electrode layers 214 based on the pattern.

As shown in FIG. 5J, the gate dielectric layers 212 are removed from the openings 508. The removal of the remaining portions of the gate electrode layers 214 exposes portions of the fin structure 206 in the openings 508. In some implementations, the etch tool 108 etches the gate dielectric layers 212 to remove the gate dielectric layers 212 based on the difference in etch selectivity between the gate dielectric layers 212 and the other layers and/or structures of the semiconductor device 200. Alternatively, a pattern in a hard mask or a photoresist layer may be formed, and the etch tool 108 may etch the gate dielectric layers 212 based on the pattern. In some implementations, a photoresist layer is formed over a first portion of the semiconductor device 200 so that a second portion of the semiconductor device 200 may be processed (e.g., an input/output (I/O) area) without affecting the first area. In some implementations, a descum operation (e.g., an I/O descum) may be performed to remove residual material from the gate dielectric layers 212 prior to removal of the gate dielectric layers 212.

As shown in FIG. 5K, work function metal (WFM) layers 510 are formed in the openings 508. The work function metal layers 510 are included for tuning the work function of the transistors of the semiconductor device 200. Particular materials and/or particular combinations of materials may be selected for the work function metal layers 510 to tune the work function of the transistors. For example, particular materials and/or particular combinations of materials may be selected for p-type (e.g., p-type metal-oxide semiconductor (PMOS)) transistors such that the work function is adjusted to be close to the valence band of the material (e.g., silicon (Si) or another semiconducting material) of the fin structure 206. As another example, particular materials and/or particular combinations of materials may be selected for n-type (e.g., n-type metal-oxide semiconductor (NMOS)) transistors such that the work function is adjusted to be close to the conduction band of the material of the fin structure 206. In some implementations, different work function metal materials are used for PMOS transistors and for NMOS transistors included in the semiconductor device 200. Examples of materials for the work function metal layers 510 include titanium nitride (TiN), tantalum nitride, (TaN), ruthenium (Ru), molybdenum (Mo), aluminum (Al), tungsten nitride (WN), zirconium silicide (ZrSi$_x$), molybdenum silicide (MoSi$_x$), tantalum silicide (TaSi$_x$), nickel silicide (NiSi$_x$), titanium (Ti), gold (Ag), and/or tantalum aluminum (TaAl), among other examples.

The deposition tool 102 and/or the plating tool 112 deposits the work function metal layers 510 on the sidewalls of the spacer layers 402 in the openings 508. In some implementations, the deposition tool 102 and/or the plating tool 112 deposits a plurality of work function metal layers 510 on one or more of the spacer layers 402. The plurality of work function metal layers 510 on a spacer layer 402 may include the same material or different materials. The deposition tool 102 and/or the plating tool 112 deposits the work function metal layers 510 using a CVD technique, a PVD technique, an ALD technique, an electroplating technique, another deposition technique described above in connection with FIG. 1A, and/or a deposition technique other than as described above in connection with FIG. 1A. In some implementations, the work function metal layers 510 are formed on the fin structure 206 at the bottom of the openings 508. In some implementations, the work function metal layers 510 are formed on the sidewalls in the openings 508 and subsequently etched (e.g., by the etch tool 108) to a height that is approximately equal to the height of the spacer layers 402.

As further shown in FIG. 5K, the work function metal layers 510 may be formed such that the height of top surfaces of the work function metal layers 510 is approximately the same as the height of the top surfaces of the spacer layers 402 in the openings 508. In some implementations, the work function metal layers 510 are formed such that the height of the top surfaces of the work function metal layers 510 is greater than the height of the top surfaces of the spacer layers 402 in the openings 508. The height of the top surfaces of the work function metal layers 510 being approximately equal to or greater than the height of the top surfaces of the spacer layers 402 increases the likelihood that the work function metal layers 510 will be fully covered by a capping layer that is to be formed on a metal gate (MG) structure that is to be formed in the openings 508. Both the top surfaces of the spacer layers 402 and the top surfaces of the work function metal layers 510 may be lower or lesser relative to the height of top surfaces of the CESL 502, which further increases the likelihood that the work function metal layers 510 will be fully covered by a capping layer that is to be formed on a metal gate structure that is to be formed in the openings 508.

As shown in FIG. 5L, the openings 508 are filled with a conductive material 512. In some implementations, the deposition tool 102 and/or the plating tool 112 deposits the conductive material 512 in the openings 508. The conductive material 512 includes a metallic material (or metal alloy), a high-k material, and/or another type of conductive material. Examples of the metallic material include cobalt (Co), tungsten (W), ruthenium (Ru), molybdenum (Mo), titanium (Ti), titanium nitride (TiN), another metallic material, and/or a combination thereof. In some implementations, the deposition tool 102 and/or the plating tool 112 over-fills the openings 508 with the conductive material 512 (e.g., to ensure that the openings 508 are fully filled with the conductive material). The planarization tool 110 may perform a planarization operation to planarize or polish the conductive material 512 such that a height of a top surface of the conductive material 512 is approximately even with tops of the openings 508.

As shown in FIG. 5M, an etching operation is performed to etch back the conductive material 512 to form metal gate (MG) layers 514 between the work function metal layers 510. The etch tool 108 may perform the etching operation using a suitable etching technique. The etching operation may be referred to as a metal gate etch back (MGEB) operation.

In some implementations, the conductive material 512 is etched back such that a height of top surfaces of the metal gate layers 514 and the height of the top surfaces of the work function metal layers 510 are approximately a same height. In some implementations, the spacer layers 402 and the work function metal layers 510 are etched in the MGEB operation such that the height of top surfaces of the metal gate layers 514 is greater relative to the height of the top surfaces of the work function metal layers 510 and the height of the top surfaces of the spacer layers 402. In these implementations, etching of the spacer layers 402 and the work function metal layers 510 results in a downward and outward slope of the spacer layers 402 and the work function metal layers 510. In other words, the top surfaces of the spacer layers 402 and the top surfaces of the work function metal layers 510 are sloped or angled downward from the metal gate layers 514 to the CESL 502. This downward and outward slope reduces, minimizes, and/or prevents the likelihood of an antenna defect forming in the transistors of the semiconductor device 200, which might otherwise occur if the top surfaces of the spacer layers 402 and the top surfaces of the work function metal layers 510 were sloped in an upward and outward manner. This reduces the likelihood of over etching of the metal gate layers 514 in subsequent semiconductor processing operations, which reduces the likelihood of an MG missing defect occurring in the semiconductor device 200.

As shown in FIG. 5N, dielectric capping layers 528 are formed over and/or on the top surfaces of the spacer layers 402, over and/or on the top surfaces of the work function metal layers 510, and over and/or on the top surfaces of the metal gate layers 514. The deposition tool 102 deposits the dielectric capping layers 528 using a CVD technique, a PVD technique, an ALD technique, another deposition technique described above in connection with FIG. 1A, and/or a deposition technique other than as described above in connection with FIG. 1A. In some implementations, the deposition tool 102 over-fills the dielectric capping layers 528, and the planarization tool 110 performs a planarization operation to planarize or polish the dielectric capping layers 528 such that a height of top surfaces of the dielectric capping layers 528 are approximately even with the top surfaces of the CESL 502.

The combination of work function metal layers 510, a metal gate layer 514, and a dielectric capping layer 528 may be referred to as a replacement gate stack 530. The dielectric capping layer 528 may be referred to as a self-aligned cap (SAC) in that the dielectric capping layer 528 protects the replacement gate stack 530 from processing damage during processing of the semiconductor device 200. The dielectric capping layers 528 include a dielectric material such as a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

As shown in FIG. 5O, the capping layers 506 are removed from the tops of the portions of the ILD layer 504 after formation of the dielectric capping layers 528. The planarization tool 110 may perform a planarization operation to planarize or polish the semiconductor device 200 to remove the capping layers 506. Removal of the capping layers 506 provides access to the underlying ILD layer 504, which enables the ILD layer 504 to be etched in preparation for forming source/drain contacts (MDs) to the source/drain regions 406.

As indicated above, FIGS. 5A-5O are provided as an example. Other examples may differ from what is described with regard to FIGS. 5A-5O.

FIGS. 6A-6F are diagrams of an example implementation 600 described herein. The example implementation 600 includes an example of forming conductive structures (e.g., metal gate interconnects, source/drain contacts (MDs)) in the device region 202 of the semiconductor device 200. FIGS. 6A-6F are illustrated from the perspective of the cross-sectional plane A-A in FIG. 2 for the device region 202.

Figure 6A:
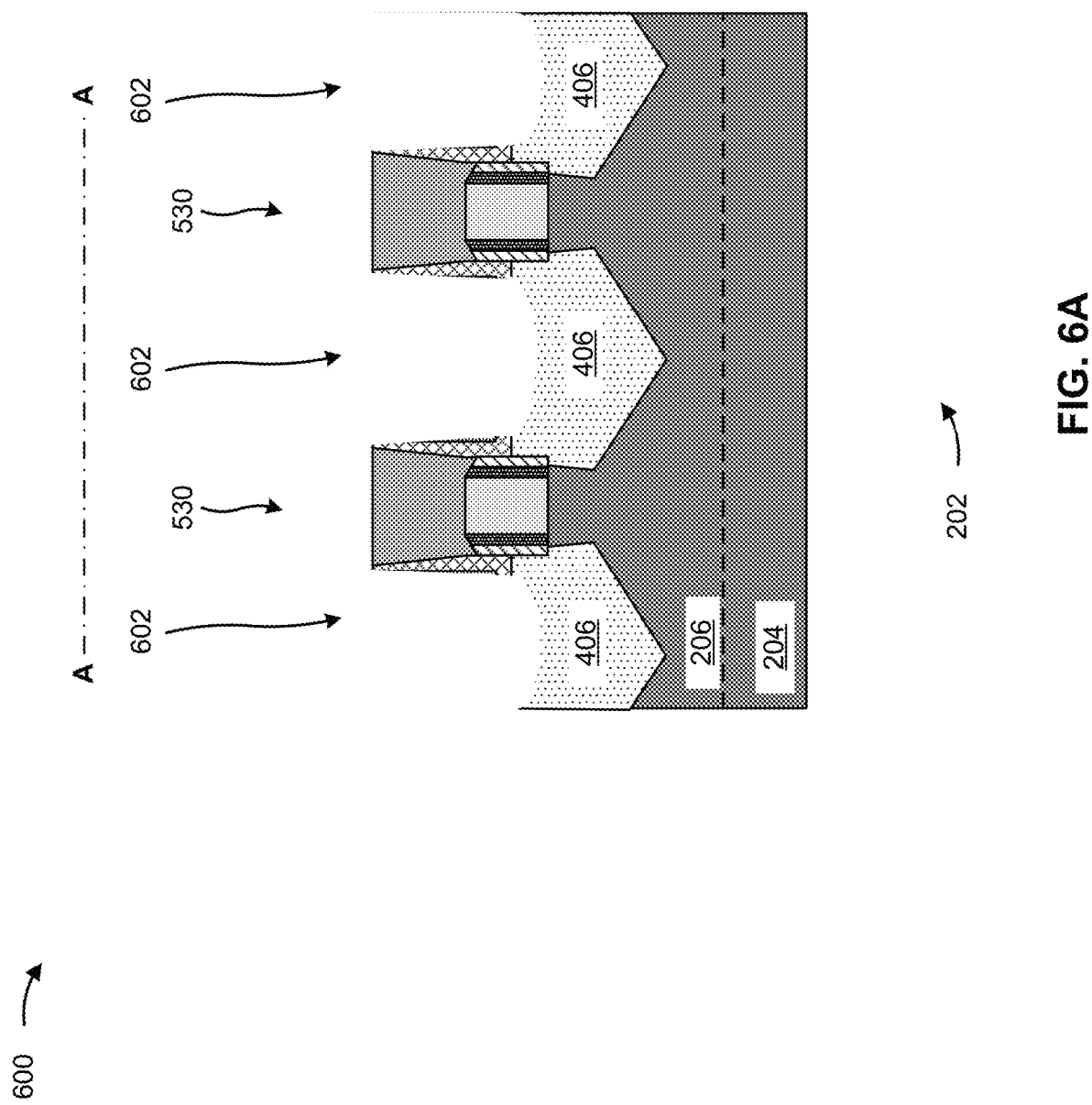

As shown in FIG. 6A, openings (or recesses) 602 are formed through one or more dielectric layers and to the source/drain regions 406. In particular, the CESL 502 and the ILD layer 504 between the replacement gate stacks 530 in the device region 202 are etched to form the openings 602 between the replacement gate stacks 530 and to the source/drain regions 406. In some implementations, the openings 602 are formed in a portion of the source/drain regions 406 such that recesses extend into a portion of the source/drain regions 406.

In some implementations, a pattern in a photoresist layer is used to form the openings 602. In these implementations, the deposition tool 102 forms the photoresist layer on the ILD layer 504, and on the replacement gate stacks 530. The exposure tool 104 exposes the photoresist layer to a radiation source to pattern the photoresist layer. The developer tool 106 develops and removes portions of the photoresist layer to expose the pattern. The etch tool 108 etches into the ILD layer 504 to form the openings 602. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 602 based on a pattern.

Figure 6B:
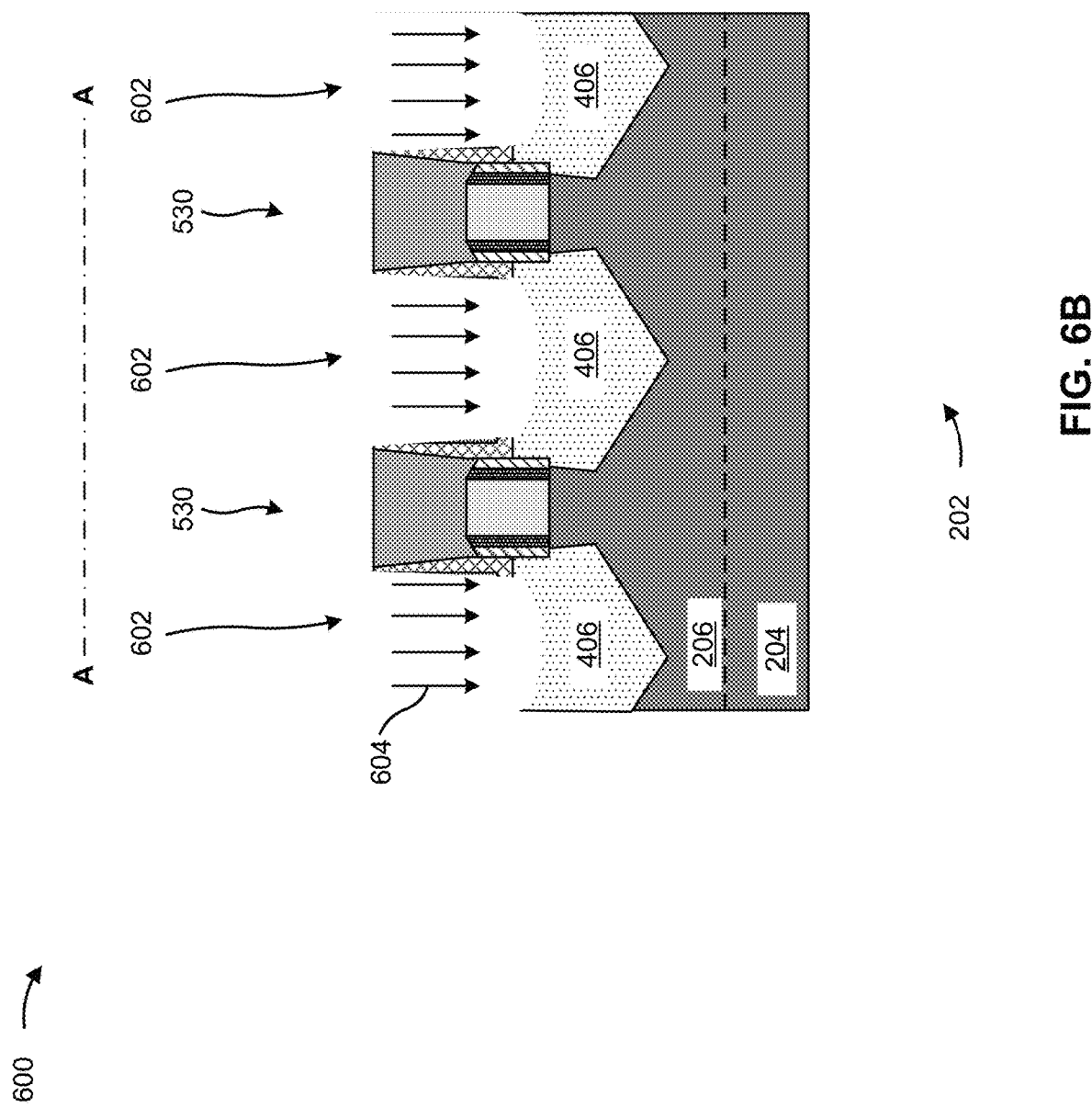

As shown in FIG. 6B, a pre-clean operation is performed to clean the surfaces in the openings 602. In particular, the semiconductor device 200 may be positioned in a first processing chamber of the deposition tool 102 (e.g., a pre-clean processing chamber), the first processing chamber may be pumped down to an at least partial vacuum (e.g., pressurized to a pressure that is included in a range of approximately 5 Torr to approximately 10 Torr, or to another pressure), and the bottom surfaces and the sidewalls in the openings 602 are cleaned using a plasma-based and/or a chemical-based pre-clean agent 604. The pre-clean operation is performed to clean (e.g., remove) oxides and other contaminants or byproducts from the top surfaces source/drain regions 406 that may have formed after the formation of the openings 602.

Figure 6C:
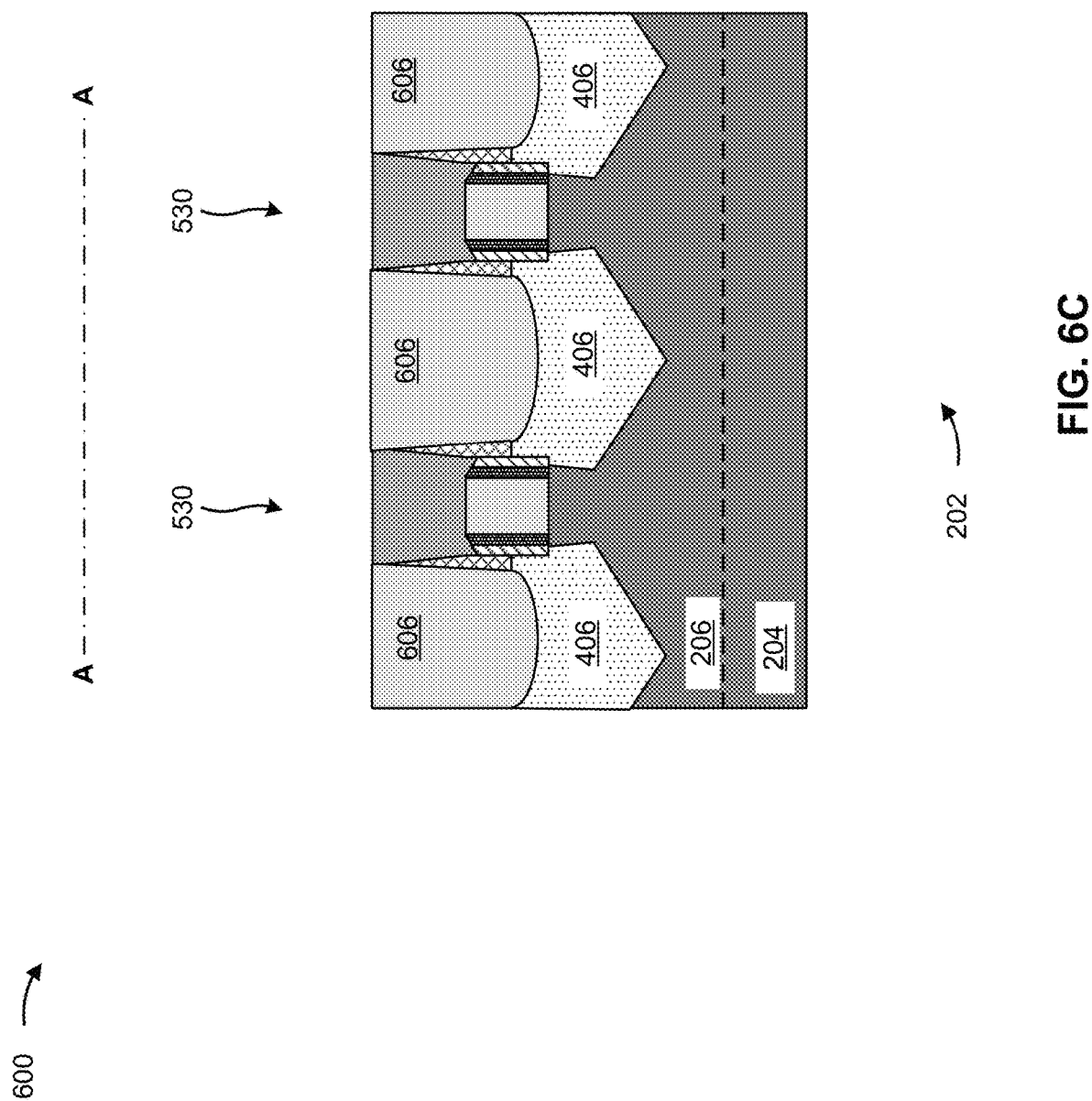

As shown in FIG. 6C, conductive structures 606 are formed in the device region 202. In particular, conductive structures 606 are formed in the openings 602 between the replacement gate stacks 530 and over the source/drain regions 406 in the openings 602. The deposition tool 102 and/or the plating tool 112 deposits the conductive structures 606 using a CVD technique, a PVD technique, an ALD technique, an electroplating technique, another deposition technique described above in connection with FIG. 1A, and/or a deposition technique other than as described above in connection with FIG. 1A. In some implementations, one or more additional layers are formed in the openings 602 prior to formation of the conductive structures 606. As an example, a metal silicide layer (e.g., titanium nitride ($TiSi_x$) or another metal silicide layer) May be formed on the top surfaces of the source/drain regions 406 prior to formation of the conductive structures 606. As another example, one or more barrier layers may be formed on the bottom surfaces and/or on the sidewalls in the openings 602 prior to formation of the conductive structures 606. As another example, one or more adhesion layers may be formed on the bottom surfaces and/or on the sidewalls in the openings 602 prior to formation of the conductive structures 606.

Figure 6D:
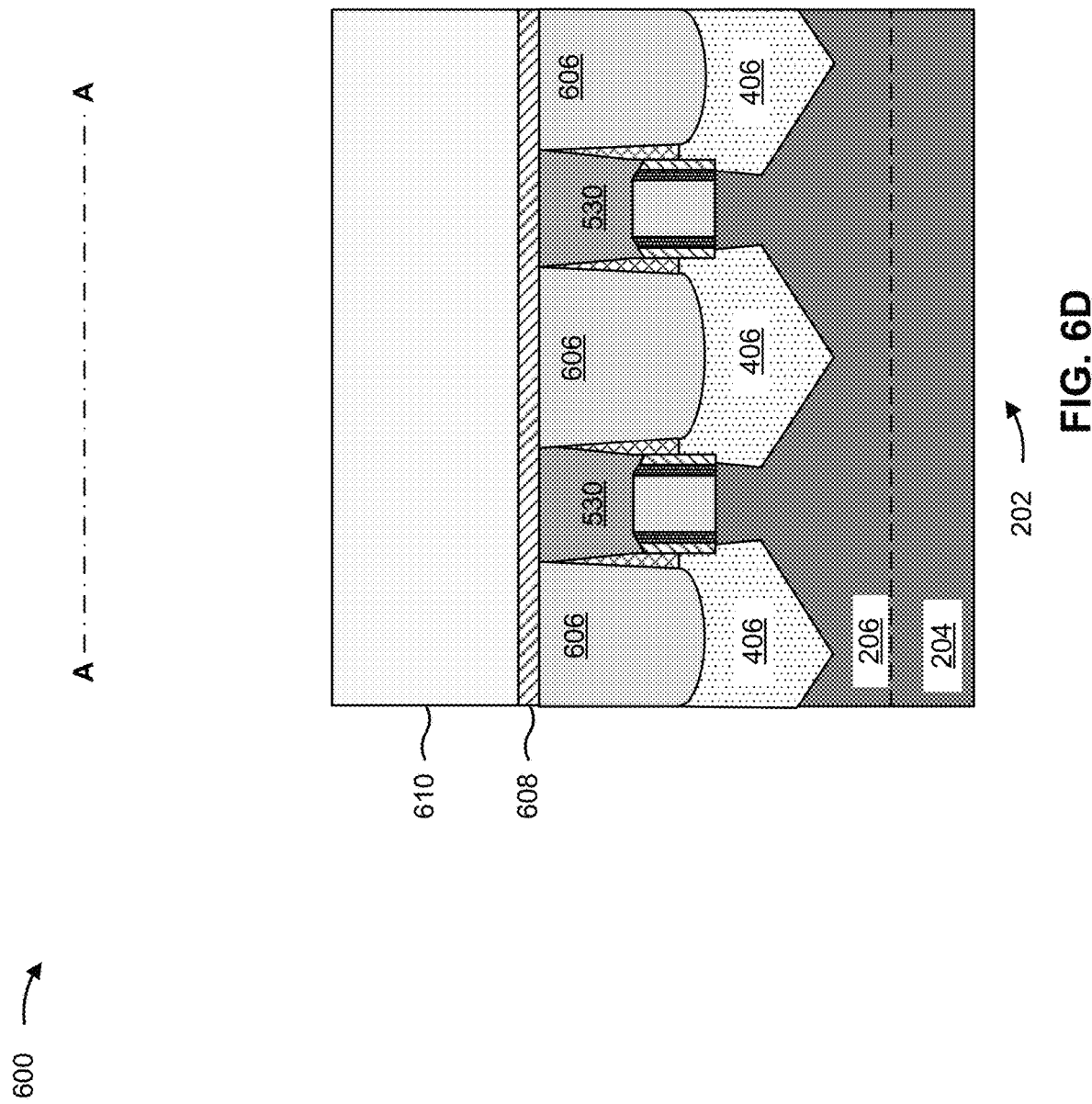

As shown in FIG. 6D, one or more layers may be formed in the device region 202 for the semiconductor device 200. The one or more layers may include an etch stop layer (ESL) 608 and a dielectric layer 610 (e.g., an ILD1 layer or an ILD2 layer). The deposition tool 102 may deposit the one or more layers using a CVD technique, a PVD technique, an ALD technique, another deposition technique described above in connection with FIG. 1A, and/or a deposition technique other than as described above in connection with FIG. 1A. The one or more layers may be included in a back end of line (BEOL) region of the semiconductor device 200. The one or more layers may be formed such that interconnects may be formed to the replacement gate stacks 530 and/or to the conductive structures 606.

Figure 6E:
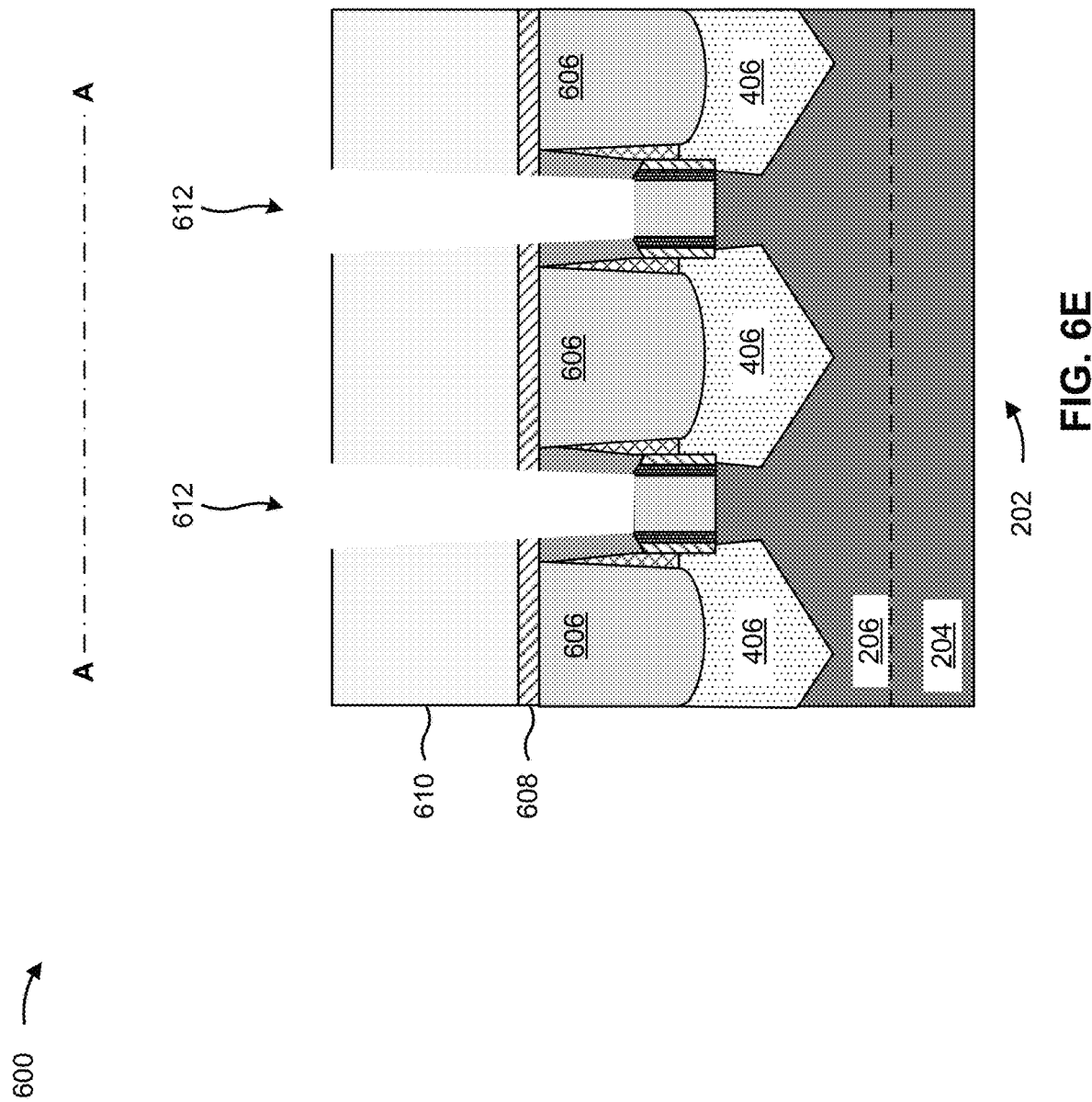

As shown in FIG. 6E, openings (or recesses) 612 are formed through the one or more layers and to the metal gate layers 514 of the replacement gate stacks 530. In some implementations, a pattern in a photoresist layer is used to form the openings 612. In these implementations, the deposition tool 102 forms the photoresist layer on the dielectric layer 610. The exposure tool 104 exposes the photoresist layer to a radiation source to pattern the photoresist layer. The developer tool 106 develops and removes portions of the photoresist layer to expose the pattern. The etch tool 108 etches through the dielectric layer 610, through the ESL 608, through the dielectric capping layers 528, and to the metal gate layers 514 to form the openings 612. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 612 based on a pattern.

Figure 6F:
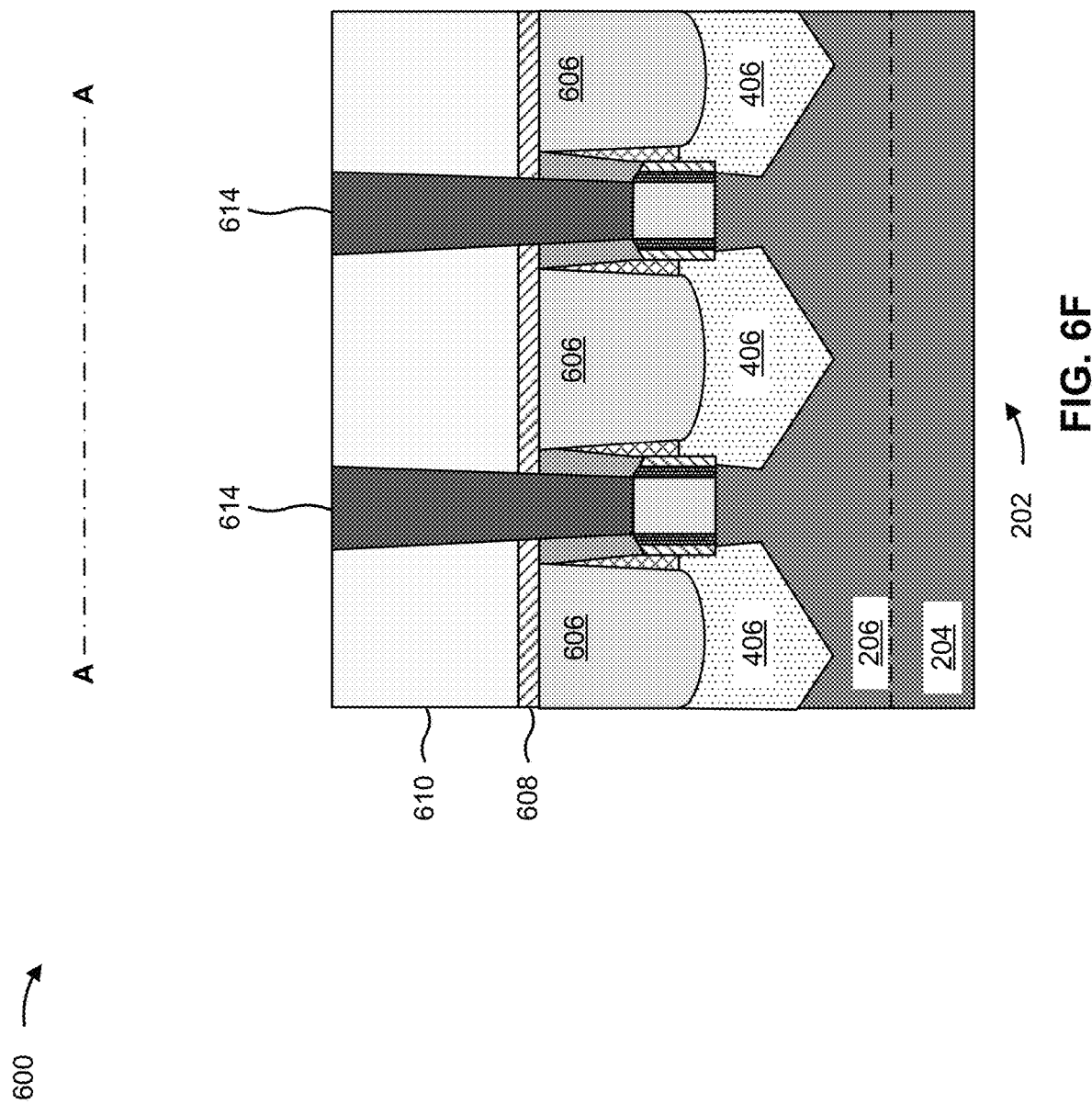

As shown in FIG. 6F, conductive structures 614 (e.g., metal gate interconnects or VGs) are formed in the device region 202. In particular, conductive structures 614 are formed in the openings 612 over the metal gate layers 514. The deposition tool 102 and/or the plating tool 112 deposits the conductive structures 614 using a CVD technique, a PVD technique, an ALD technique, an electroplating technique, another deposition technique described above in connection with FIG. 1A, and/or a deposition technique other than as described above in connection with FIG. 1A.

As indicated above, FIGS. 6A-6F are provided as an example. Other examples may differ from what is described with regard to FIGS. 6A-6F.

Figure 7:
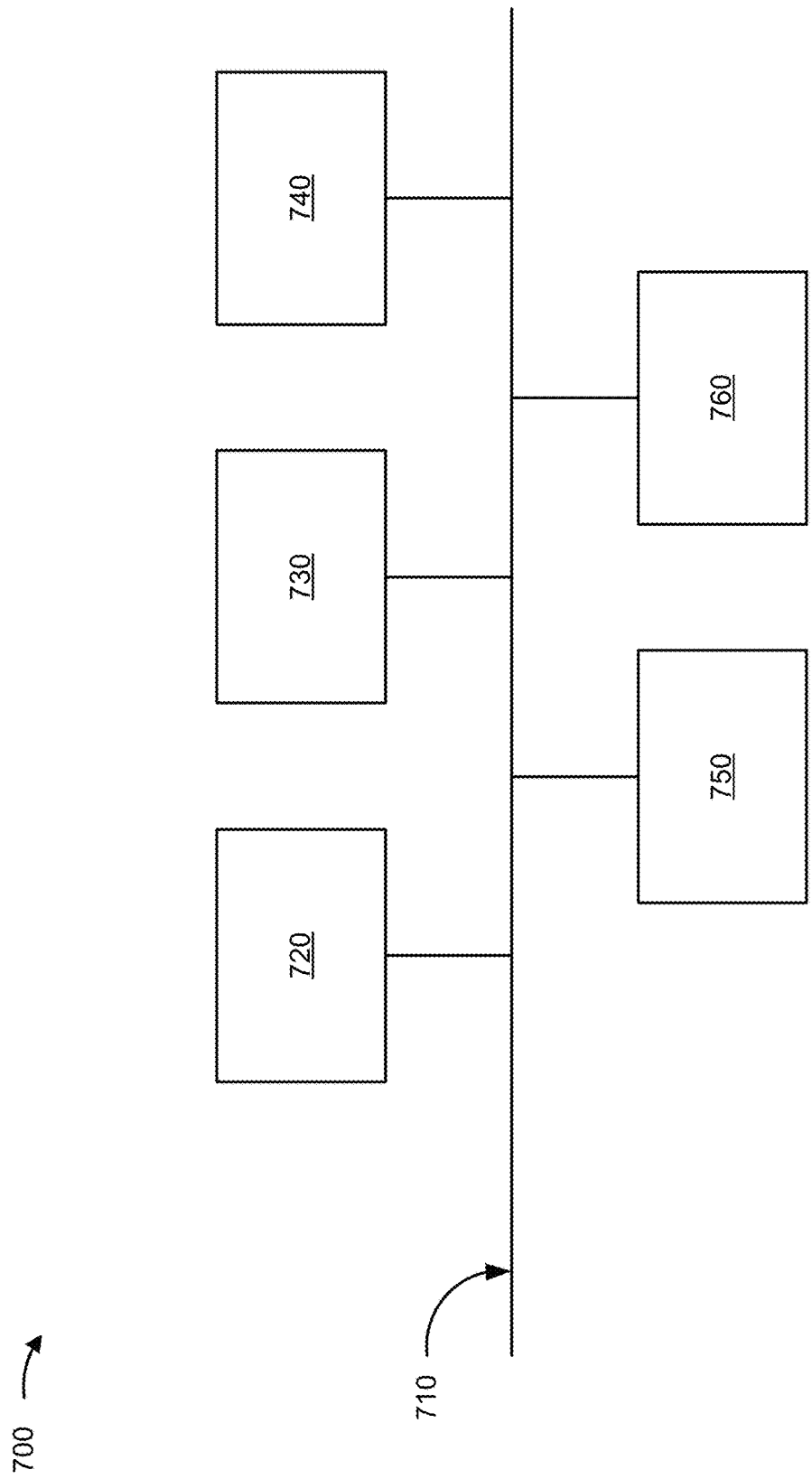
FIG. 7 is a diagram of example components of one or more devices of FIGS. 1A and 1B described herein.

FIG. 7 is a diagram of example components of a device 700. In some implementations, one or more of the semiconductor processing tools 102-112 and/or the wafer/die transport tool 114 may include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
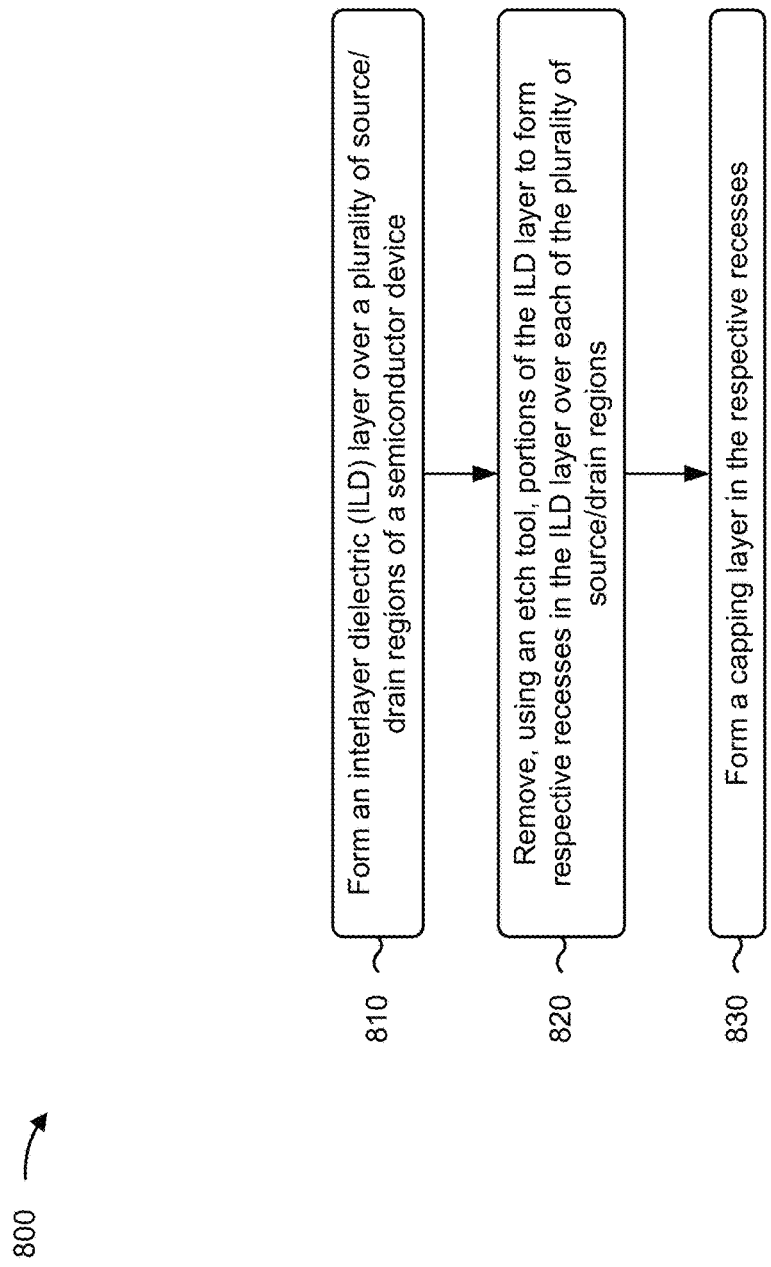
FIGS. 8-10 are flowcharts of example processes associated with forming a semiconductor device.

FIG. 8 is a flowchart of an example process 800 associated with forming a semiconductor device. In some implementations, one or more process blocks of FIG. 8 are performed by one or more semiconductor processing tools (e.g., one or more of the semiconductor processing tools 102-114). Additionally, or alternatively, one or more process blocks of FIG. 8 may be performed by one or more components of device 700, such as processor 720, memory 730, input component 740, output component 750, and/or communication component 760.

As shown in FIG. 8, process 800 may include forming an ILD layer over a plurality of source/drain regions of a semiconductor device (block 810). For example, one or more of the semiconductor processing tools 102-114 may form an ILD layer 504 over a plurality of source/drain regions 406 of a semiconductor device 200, as described above.

As further shown in FIG. 8, process 800 may include removing, using an etch tool, portions of the ILD layer to form respective recesses in the ILD layer over each of the plurality of source/drain regions (block 820). For example, the etch tool 108 may remove portions of the ILD layer 504 to form respective recesses 505 in the ILD layer over each of the plurality of source/drain regions 406, as described above. In some implementations, a first flow rate of argon (Ar) at a first inlet 152 of the etch tool 108, a second flow rate of argon at a second inlet 150 of the etch tool 108, and a third flow rate of argon at a third inlet 140 of the etch tool 108 are configured to promote distribution of etchants in a mixing manifold of the etch tool to reduce a gradient of the etchants across the semiconductor device.

As further shown in FIG. 8, process 800 may include forming a capping layer in the respective recesses (block 830). For example, one or more of the semiconductor processing tools 102-114 may form a capping layer 506 in the respective recesses 505, as described above.

Process 800 may include additional implementations, such as any single implementation or any combination of implementations described below and/or in connection with one or more other processes described elsewhere herein.

In a first implementation, the first inlet 152 is closer to an inlet port 126 of a processing chamber 116 of the etch tool 108 relative to the second inlet 150, and the second inlet 150 is closer to the inlet port 126 of the processing chamber 116 relative to the third inlet 140. In a second implementation, alone or in combination with the first implementation, the first flow rate is greater relative to the second flow rate and the third flow rate. In a third implementation, alone or in combination with one or more of the first and second implementations, the first flow rate being greater relative to the second flow rate and the third flow rate promotes uniformity of depth (e.g., D1-D3) of the respective recesses 505.

In a fourth implementation, alone or in combination with one or more of the first through third implementations, the first inlet 152 is located in a mixing manifold 148 of the etch tool 108, the second inlet 150 is located at an inlet adapter 144 of the etch tool 108, and the third inlet 140 is located at an RPS 118 of the etch tool 108. In a fifth implementation, alone or in combination with one or more of the first through fourth implementations, removing the portions of the ILD layer 504 includes removing the portions of the ILD layer 504 using a first etchant, of the etchants, that is provided through the first inlet 152, and a second etchant, of the etchants, that is provided through the second inlet 150. In a sixth implementation, alone or in combination with one or more of the first through fifth implementations, the first etchant includes hydrofluoric acid (HF), and the second etchant includes ammonia ($NH_3$).

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Figure 9:
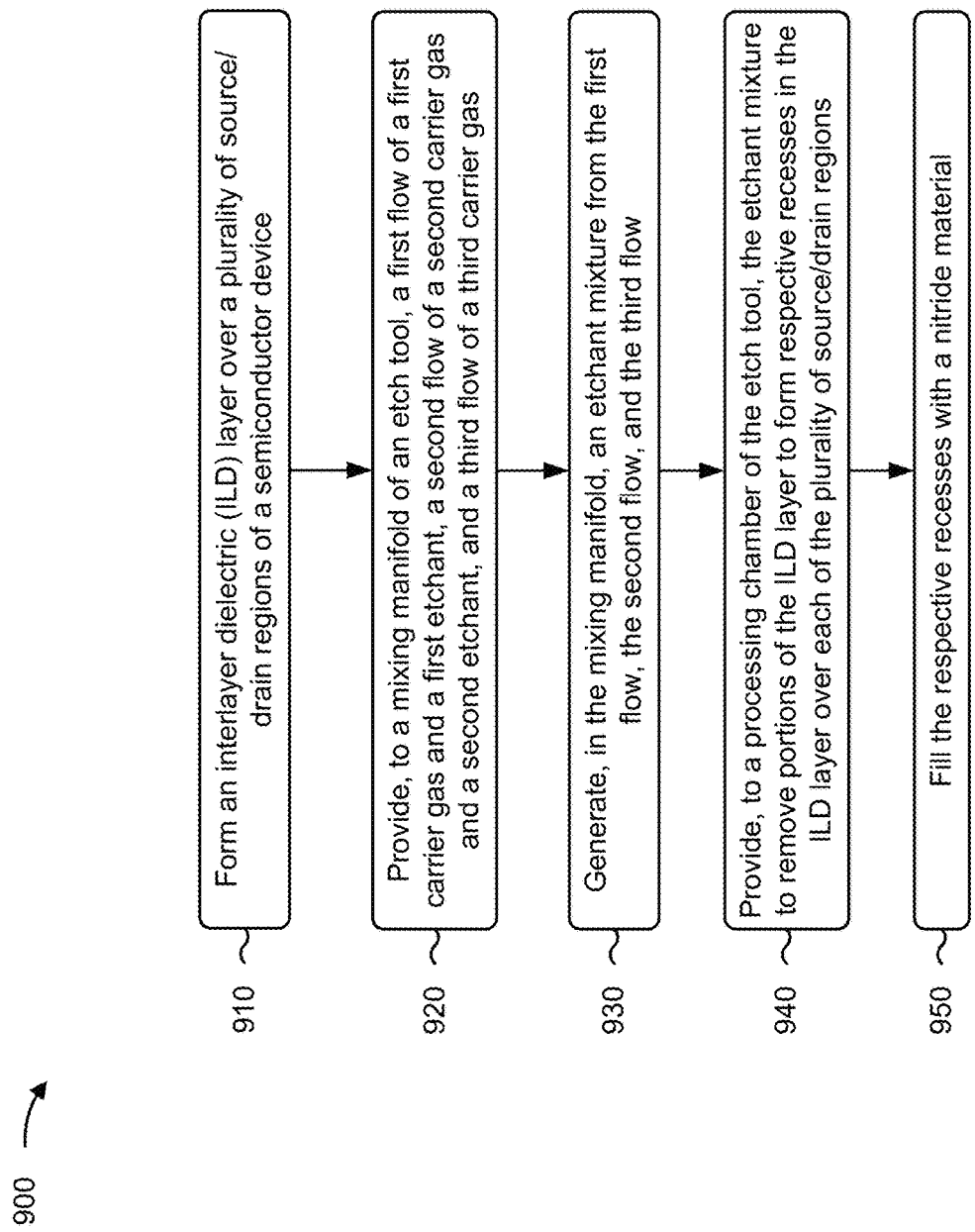

FIG. 9 is a flowchart of an example process 900 associated with forming a semiconductor device. In some implementations, one or more process blocks of FIG. 9 are performed by one or more semiconductor processing tools (e.g., one or more of the semiconductor processing tools 102-114). Additionally, or alternatively, one or more process blocks of FIG. 9 may be performed by one or more components of device 700, such as processor 720, memory 730, input component 740, output component 750, and/or communication component 760.

As shown in FIG. 9, process 900 may include forming an ILD layer over a plurality of source/drain regions of a semiconductor device (block 910). For example, one or more of the semiconductor processing tools 102-114 may form an ILD layer 504 over a plurality of source/drain regions 406 of a semiconductor device 200, as described above.

As further shown in FIG. 9, process 900 may include providing, to a mixing manifold of an etch tool, a first flow of a first carrier gas and a first etchant, a second flow of a second carrier gas and a second etchant, and a third flow of a third carrier gas (block 920). For example, the etch tool 108 may provide, to a mixing manifold 148 of the etch tool 108, a first flow of a first carrier gas and a first etchant, a second flow of a second carrier gas and a second etchant, and a third flow of a third carrier gas, as described above.

As further shown in FIG. 9, process 900 may include generating, in the mixing manifold, an etchant mixture from the first flow, the second flow, and the third flow (block 930). For example, the etch tool 108 may generate, in the mixing manifold 148, an etchant mixture from the first flow, the second flow, and the third flow, as described above. In some implementations, a first flow rate of the first carrier gas, a second flow rate of the second carrier gas, and a third flow rate of the third carrier gas are configured to promote uniform distribution of the first etchant and the second etchant in the etchant mixture.

As further shown in FIG. 9, process 900 may include providing, to a processing chamber of the etch tool, the etchant mixture to remove portions of the ILD layer to form respective recesses in the ILD layer over each of the plurality of source/drain regions (block 940). For example, the etch tool 108 may provide, to a processing chamber 116 of the etch tool 108, the etchant mixture to remove portions of the ILD layer 504 to form respective recesses 505 in the ILD layer 504 over each of the plurality of source/drain regions 406, as described above.

As further shown in FIG. 9, process 900 may include filling the respective recesses with a dielectric material (block 950). For example, one or more of the semiconductor processing tools 102-114 may fill the respective recesses 505 with a dielectric material, as described above.

Process 900 may include additional implementations, such as any single implementation or any combination of implementations described below and/or in connection with one or more other processes described elsewhere herein. In a first implementation, providing the third flow of the third carrier gas includes providing the third flow of the third carrier gas to the mixing manifold 148 to resist backflow of gas to an RPS 118 of the etch tool 108.

In a second implementation, alone or in combination with the first implementation, the first flow rate of the first carrier gas is greater relative to the third flow rate of the third carrier gas, and the first flow rate of the first carrier gas being greater relative to the third flow rate of the third carrier gas reduces a likelihood of the etchant mixture being provided to the processing chamber 116 before the first etchant and the second etchant are uniformly distributed in the etchant mixture. In a third implementation, alone or in combination with one or more of the first and second implementations, providing the first flow of the first carrier gas and the first etchant to the mixing manifold 148 includes providing the first flow of the first carrier gas and the first etchant to the mixing manifold 148 through an inlet 152 in the mixing manifold 148.

In a fourth implementation, alone or in combination with one or more of the first through third implementations, providing the second flow of the second carrier gas and the second etchant to the mixing manifold 148 includes providing the second flow of the second carrier gas and the second etchant to the mixing manifold 148 through a second inlet 150 in an inlet adapter 144 upstream relative to the mixing manifold 148. In a fifth implementation, alone or in combination with one or more of the first through fourth implementations, the first flow rate of the first carrier gas is greater relative to the second flow rate of the second carrier gas and the third flow rate of the third carrier gas, and the second flow rate of the second carrier gas and the third flow rate of the third carrier gas are approximately equal.

In a sixth implementation, alone or in combination with one or more of the first through fifth implementations, the first flow rate of the first carrier gas is greater relative to the second flow rate of the second carrier gas and the third flow rate of the third carrier gas, and the second flow rate of the second carrier gas is lesser relative to the third flow rate of the third carrier gas.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Figure 10:
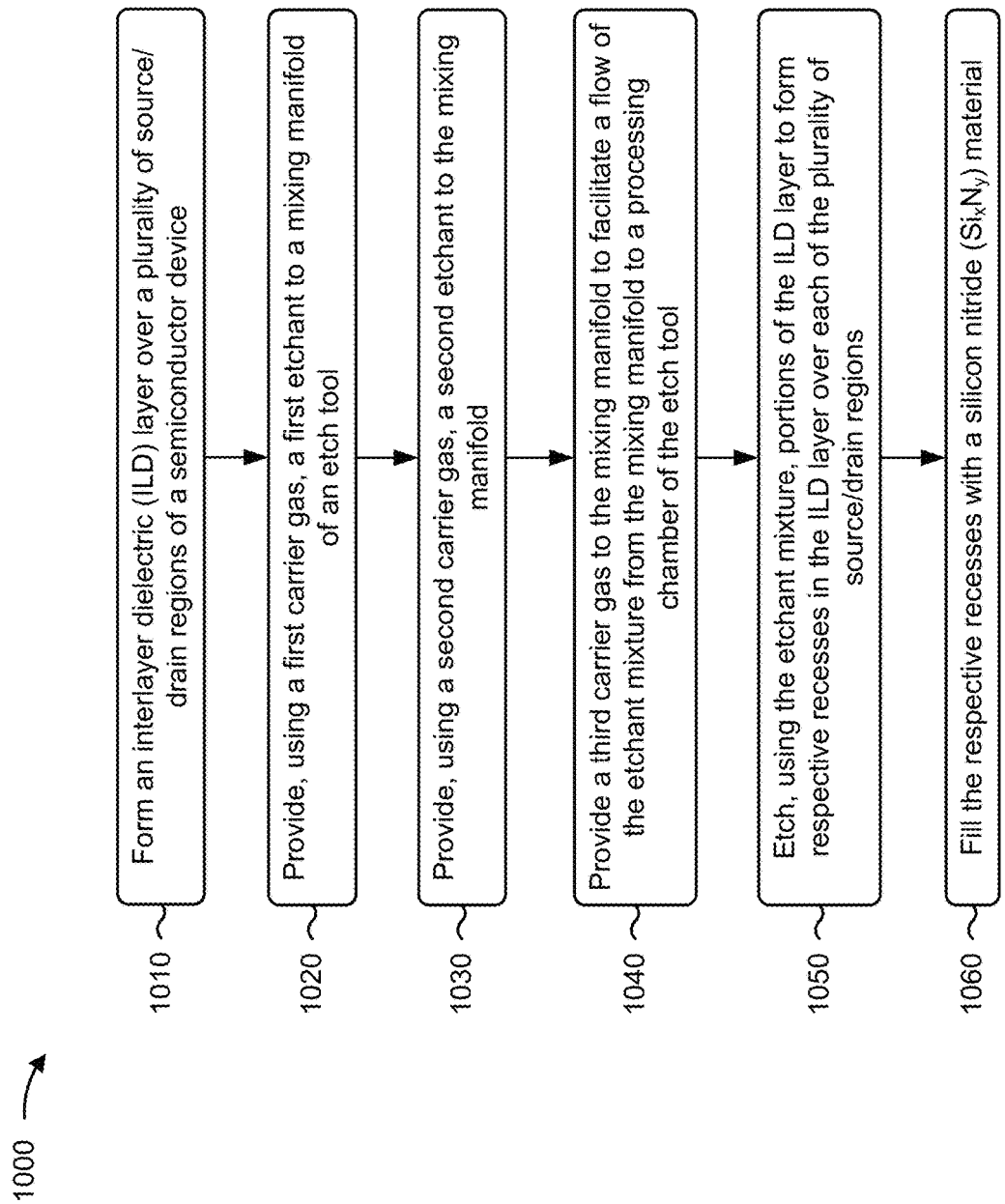

FIG. 10 is a flowchart of an example process 1000 associated with forming a semiconductor device. In some implementations, one or more process blocks of FIG. 10 are performed by one or more semiconductor processing tools (e.g., one or more of the semiconductor processing tools 102-114). Additionally, or alternatively, one or more process blocks of FIG. 10 may be performed by one or more components of device 700, such as processor 720, memory 730, input component 740, output component 750, and/or communication component 760.

As shown in FIG. 10, process 1000 may include forming an ILD layer over a plurality of source/drain regions of a semiconductor device (block 1010). For example, one or more of the semiconductor processing tools 102-114 may form an ILD layer 504 over a plurality of source/drain regions 406 of a semiconductor device 200, as described above.

As further shown in FIG. 10, process 1000 may include providing, using a first carrier gas, a first etchant to a mixing manifold of an etch tool (block 1020). For example, the etch tool 108 may provide, using a first carrier gas, a first etchant to a mixing manifold 148 of the etch tool 108, as described above.

As further shown in FIG. 10, process 1000 may include providing, using a second carrier gas, a second etchant to the mixing manifold (block 1030). For example, the etch tool 108 may provide, using a second carrier gas, a second etchant to the mixing manifold 148, as described above. In some implementations, the first etchant and the second etchant are mixed in the mixing manifold 148 to form an etchant mixture.

As further shown in FIG. 10, process 1000 may include providing a third carrier gas to the mixing manifold to facilitate a flow of the etchant mixture from the mixing manifold to a processing chamber of the etch tool (block 1040). For example, the etch tool 108 may provide a third carrier gas to the mixing manifold 148 to facilitate a flow of the etchant mixture from the mixing manifold 148 to a processing chamber 116 of the etch tool 108, as described above.

As further shown in FIG. 10, process 1000 may include etching, using the etchant mixture, portions of the ILD layer to form respective recesses in the ILD layer over each of the plurality of source/drain regions (block 1050). For example, the etch tool 108 may etch, using the etchant mixture, portions of the ILD layer 504 to form respective recesses 505 in the ILD layer 504 over each of the plurality of source/drain regions 406, as described above. In some implementations, a first flow rate of the first carrier gas, a second flow rate of the second carrier gas, and a third flow rate of the third carrier gas are configured to promote uniform distribution of the etchant mixture across the semiconductor device 200.

As further shown in FIG. 10, process 1000 may include filling the respective recesses with a silicon nitride ($Si_xN_y$) material (block 1060). For example, one or more of the semiconductor processing tools 102-114 may fill the respective recesses 505 with a silicon nitride ($Si_xN_y$) material, as described above.

Process 1000 may include additional implementations, such as any single implementation or any combination of implementations described below and/or in connection with one or more other processes described elsewhere herein.

In a first implementation, providing the first etchant to the mixing manifold 148 includes providing the first etchant directly into the mixing manifold 148 through an inlet 152 in the mixing manifold 148. In a second implementation, alone or in combination with the first implementation, providing the second etchant to the mixing manifold 148 includes providing the second etchant from an inlet 150 in an inlet adapter 144 of the etch tool 108 to the mixing manifold 148 through the inlet adapter 144 and through a diffuser plate 146 of the etch tool 108. In a third implementation, alone or in combination with one or more of the first and second implementations, providing the third carrier gas to the mixing manifold 148 includes providing the third carrier gas from an inlet 140 in an RPS 118 of the etch tool 108 to the mixing manifold 148 through an RPS insulator 142 of the etch tool 108, through an inlet adapter 144 of the etch tool 108, and through a diffuser plate 146 of the etch tool 108. In a fourth implementation, alone or in combination with one or more of the first through third implementations, the first flow rate of the first carrier gas is greater relative to the second flow rate of the second carrier gas and the third flow rate of the third carrier gas, and the second flow rate of the second carrier gas is greater relative to the third flow rate of the third carrier gas. In a fifth implementation, alone or in combination with one or more of the first through fourth implementations, differences in depths of the respective recesses 505 are in a range of approximately 13.6 angstroms to approximately 17 angstroms.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

In this way, recesses may be formed in portions of an ILD layer of a semiconductor device in a highly uniform manner. Uniformity in depths of the recesses may be increased by configuring flows of gases in an etch tool to promote uniformity of etch rates (and thus, etch depth) across the semiconductor device, from semiconductor device to semiconductor device, and/or from wafer to wafer. In particular, the flow rates of gases at various inlets of the etch tool may be optimized to provide recess depth tuning, which increases the process window for forming the recesses in the portions of the ILD layer. In this way, the increased uniformity of the recesses in the portions of the ILD layer enables highly uniform capping layers to be formed in the recesses. For example, the techniques described herein may enable the uniformity of recesses formed in portions of an ILD layer (and thus, the uniformity in thickness of capping layers to be formed in the recesses) from approximately 4 nanometers of variation to approximately 1.6 nanometers of variation or less. However, other values are within the scope of the present disclosure. The uniformity of the resulting capping layers decreases the likelihood of defect formation and/or yield loss of semiconductor devices formed on a wafer and/or increases the performance of the semiconductor devices, among other examples.

As described in greater detail above, some implementations described herein provide a method. The method includes forming an ILD layer over a plurality of source/drain regions of a semiconductor device. The method includes removing, using an etch tool, portions of the ILD layer to form respective recesses in the ILD layer over each of the plurality of source/drain regions, where a first flow rate of argon (Ar) at a first inlet of the etch tool, a second flow rate of argon at a second inlet of the etch tool, and a third flow rate of argon at a third inlet of the etch tool are configured to promote distribution of etchants in a mixing manifold of the etch tool to reduce a gradient of the etchants across the semiconductor device. The method includes forming a capping layer in the respective recesses.

As described in greater detail above, some implementations described herein provide a method. The method includes forming an ILD layer over a plurality of source/drain regions of a semiconductor device. The method includes providing, to a mixing manifold of an etch tool, a first flow of a first carrier gas and a first etchant, a second flow of a second carrier gas and a second etchant, and a third flow of a third carrier gas. The method includes generating, in the mixing manifold, an etchant mixture from the first flow, the second flow, and the third flow, where a first flow rate of the first carrier gas, a second flow rate of the second carrier gas, and a third flow rate of the third carrier gas are configured to promote uniform distribution of the first etchant and the second etchant in the etchant mixture. The method includes providing, to a processing chamber of the etch tool, the etchant mixture to remove portions of the ILD layer to form respective recesses in the ILD layer over each of the plurality of source/drain regions. The method includes filling the respective recesses with a dielectric material.

As described in greater detail above, some implementations described herein provide a method. The method includes forming an ILD layer over a plurality of source/drain regions of a semiconductor device. The method includes providing, using a first carrier gas, a first etchant to a mixing manifold of an etch tool. The method includes providing, using a second carrier gas, a second etchant to the mixing manifold, where the first etchant and the second etchant are mixed in the mixing manifold to form an etchant mixture. The method includes providing a third carrier gas to the mixing manifold to facilitate a flow of the etchant mixture from the mixing manifold to a processing chamber of the etch tool. The method includes etching, using the etchant mixture, portions of the ILD layer to form respective recesses in the ILD layer over each of the plurality of source/drain regions, where a first flow rate of the first carrier gas, a second flow rate of the second carrier gas, and a third flow rate of the third carrier gas are configured to promote uniform distribution of the etchant mixture across the semiconductor device. The method includes filling the respective recesses with a silicon nitride ($Si_xN_y$) material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an interlayer dielectric (ILD) layer over a plurality of source/drain regions of a semiconductor device;
   removing, using an etch tool, portions of the ILD layer to form respective recesses in the ILD layer over each of the plurality of source/drain regions,
      wherein a first flow rate of argon (Ar) at a first inlet of the etch tool, a second flow rate of argon at a second inlet of the etch tool, and a third flow rate of argon at a third inlet of the etch tool are configured to promote distribution of etchants in a mixing manifold of the etch tool to reduce a gradient of the etchants across the semiconductor device; and
   forming a capping layer in the respective recesses.

2. The method of claim 1, wherein the first inlet is closer to an inlet port of a processing chamber of the etch tool relative to the second inlet; and
   wherein the second inlet is closer to the inlet port of the processing chamber relative to the third inlet.

3. The method of claim 2, wherein the first flow rate is greater relative to the second flow rate and the third flow rate.

4. The method of claim 3, wherein the first flow rate being greater relative to the second flow rate and the third flow rate promotes uniformity of depth of the respective recesses.

5. The method of claim 2, wherein the first inlet is located in the mixing manifold of the etch tool;
   wherein the second inlet is located at an inlet adapter of the etch tool; and
   wherein the third inlet is located at a remote plasma source (RPS) of the etch tool.

6. The method of claim 1, wherein removing the portions of the ILD layer comprises:
   removing the portions of the ILD layer using:
      a first etchant, of the etchants, that is provided through the first inlet, and
      a second etchant, of the etchants, that is provided through the second inlet.

7. The method of claim 6, wherein the first etchant includes hydrofluoric acid (HF); and
   wherein the second etchant includes ammonia ($NH_3$).

8. A method, comprising:
   forming an interlayer dielectric (ILD) layer over a plurality of source/drain regions of a semiconductor device;
   providing, to a mixing manifold of an etch tool:
      a first flow of a first carrier gas and a first etchant, a second flow of a second carrier gas and a second etchant, and a third flow of a third carrier gas;

generating, in the mixing manifold, an etchant mixture from the first flow, the second flow, and the third flow, wherein a first flow rate of the first carrier gas, a second flow rate of the second carrier gas, and a third flow rate of the third carrier gas are configured to promote uniform distribution of the first etchant and the second etchant in the etchant mixture;

providing, to a processing chamber of the etch tool, the etchant mixture to remove portions of the ILD layer to form respective recesses in the ILD layer over each of the plurality of source/drain regions; and filling the respective recesses with a dielectric material.

9. The method of claim 8, wherein providing the third flow of the third carrier gas comprises:

providing the third flow of the third carrier gas to the mixing manifold to resist backflow of gas to a remote plasma source (RPS) of the etch tool.

10. The method of claim 8, wherein the first flow rate of the first carrier gas is greater relative to the third flow rate of the third carrier gas; and wherein the first flow rate of the first carrier gas being greater relative to the third flow rate of the third carrier gas reduces a likelihood of the etchant mixture being provided to the processing chamber before the first etchant and the second etchant are uniformly distributed in the etchant mixture.

11. The method of claim 8, wherein providing the first flow of the first carrier gas and the first etchant to the mixing manifold comprises:

providing the first flow of the first carrier gas and the first etchant to the mixing manifold through an inlet in the mixing manifold.

12. The method of claim 11, wherein providing the second flow of the second carrier gas and the second etchant to the mixing manifold comprises:

providing the second flow of the second carrier gas and the second etchant to the mixing manifold through a second inlet in an inlet adapter upstream relative to the mixing manifold.

13. The method of claim 8, wherein the first flow rate of the first carrier gas is greater relative to the second flow rate of the second carrier gas and the third flow rate of the third carrier gas; and wherein the second flow rate of the second carrier gas and the third flow rate of the third carrier gas are approximately equal.

14. The method of claim 8, wherein the first flow rate of the first carrier gas is greater relative to the second flow rate of the second carrier gas and the third flow rate of the third carrier gas; and wherein the second flow rate of the second carrier gas is lesser relative to the third flow rate of the third carrier gas.

15. A method, comprising:

forming an interlayer dielectric (ILD) layer over a plurality of source/drain regions of a semiconductor device;

providing, using a first carrier gas, a first etchant to a mixing manifold of an etch tool;

providing, using a second carrier gas, a second etchant to the mixing manifold, wherein the first etchant and the second etchant are mixed in the mixing manifold to form an etchant mixture;

providing a third carrier gas to the mixing manifold to facilitate a flow of the etchant mixture from the mixing manifold to a processing chamber of the etch tool;

etching, using the etchant mixture, portions of the ILD layer to form respective recesses in the ILD layer over each of the plurality of source/drain regions, wherein a first flow rate of the first carrier gas, a second flow rate of the second carrier gas, and a third flow rate of the third carrier gas are configured to promote uniform distribution of the etchant mixture across the semiconductor device; and filling the respective recesses with a silicon nitride ($Si_xN_y$) material.

16. The method of claim 15, wherein providing the first etchant to the mixing manifold comprises:

providing the first etchant directly into the mixing manifold through an inlet in the mixing manifold.

17. The method of claim 15, wherein providing the second etchant to the mixing manifold comprises:

providing the second etchant from an inlet in an inlet adapter of the etch tool to the mixing manifold through the inlet adapter and through a diffuser plate of the etch tool.

18. The method of claim 15, wherein providing the third carrier gas to the mixing manifold comprises:

providing the third carrier gas from an inlet in a remote plasma source (RPS) of the etch tool to the mixing manifold through an RPS insulator of the etch tool, through an inlet adapter of the etch tool, and through a diffuser plate of the etch tool.

19. The method of claim 15, wherein the first flow rate of the first carrier gas is greater relative to the second flow rate of the second carrier gas and the third flow rate of the third carrier gas; and wherein the second flow rate of the second carrier gas is greater relative to the third flow rate of the third carrier gas.

20. The method of claim 15, wherein differences in depths of the respective recesses are in a range of approximately 13.6 angstroms to approximately 17 angstroms.

* * * * *